United States Patent
Nagaoka

(10) Patent No.: US 6,307,772 B1
(45) Date of Patent: Oct. 23, 2001

(54) STATIC TYPE SEMICONDUCTOR MEMORY DEVICE FOR LOWER CURRENT CONSUMPTION

(75) Inventor: Hideaki Nagaoka, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/546,710

(22) Filed: Apr. 10, 2000

(30) Foreign Application Priority Data

Sep. 29, 1999 (JP) ............................................. 11-276667 P

(51) Int. Cl.$^7$ ................................................... G11C 11/00
(52) U.S. Cl. ......................... 365/154; 365/156; 365/227
(58) Field of Search ................................. 365/154, 156, 365/194, 226, 227, 129, 189.01

(56) References Cited

U.S. PATENT DOCUMENTS

| | | | |
|---|---|---|---|
| 4,578,778 | * 3/1986 | Aoyama | 365/190 |
| 4,751,683 | * 6/1988 | Wada et al. | 365/230 |
| 5,706,231 | * 1/1998 | Kokubo | 365/200 |

FOREIGN PATENT DOCUMENTS

| | | |
|---|---|---|
| 58-41486 | 3/1983 | (JP). |
| 6-195997 | 7/1994 | (JP). |

\* cited by examiner

*Primary Examiner*—Hoai V. Ho
(74) *Attorney, Agent, or Firm*—McDermott, Will & Emery

(57) ABSTRACT

In an SRAM, a breaking circuit includes a P channel MOS transistor connected between the source of an N channel MOS transistor, which forms a bit line load, and one end of a bit line, and an inverter to supply the gate of the P channel MOS transistor with an inverted signal of a signal which appears at the one end of the bit line. If the bit line is short-circuited with a line of a ground potential and is defective, the P channel MOS transistor is rendered non-conductive, thereby preventing current leakage from a line of a power supply potential through the defective bit line to the ground potential line. Therefore, current consumption is reduced.

7 Claims, 23 Drawing Sheets

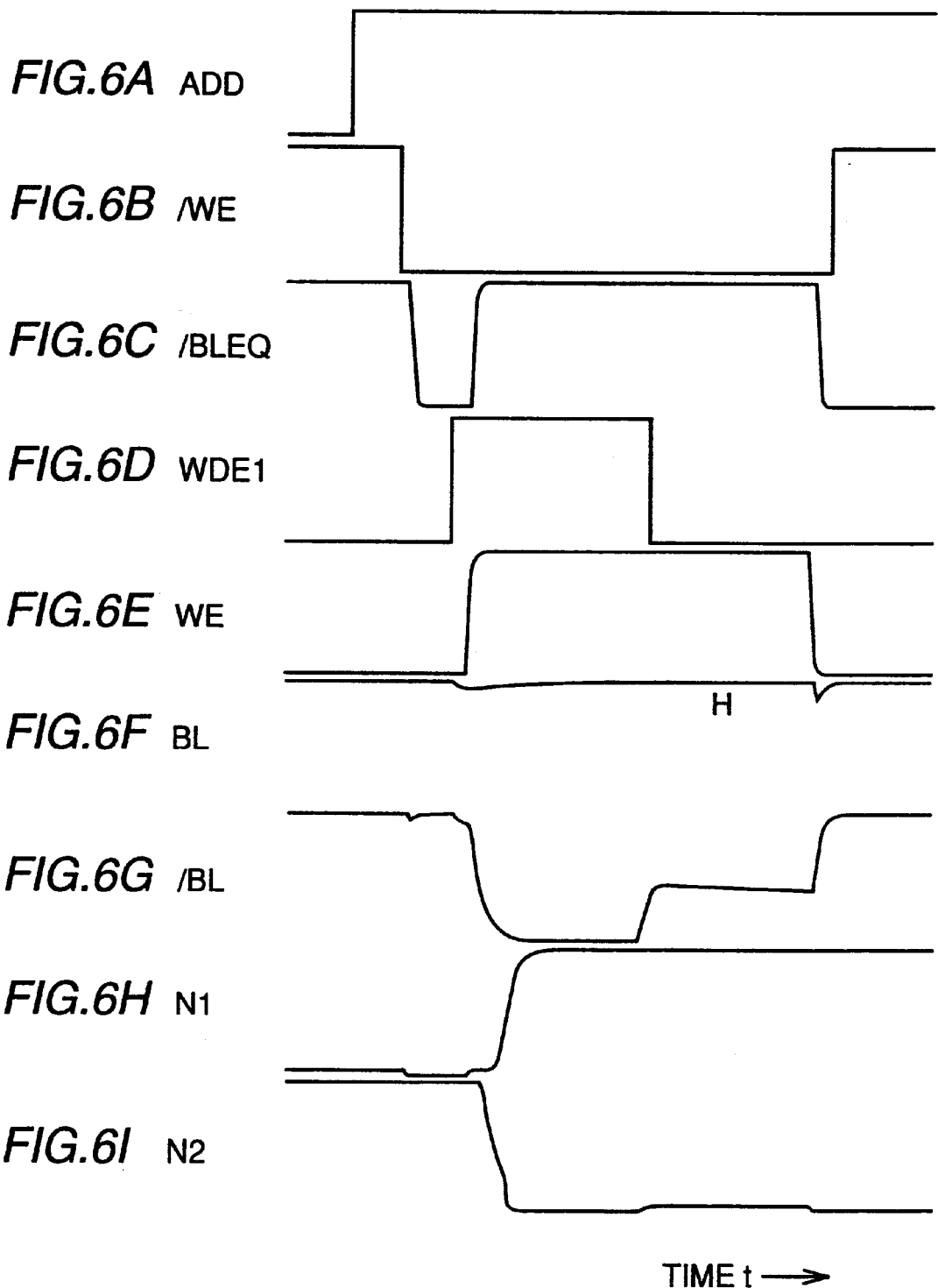

FIG.7A ADD
FIG.7B /BLEQ
FIG.7C WL
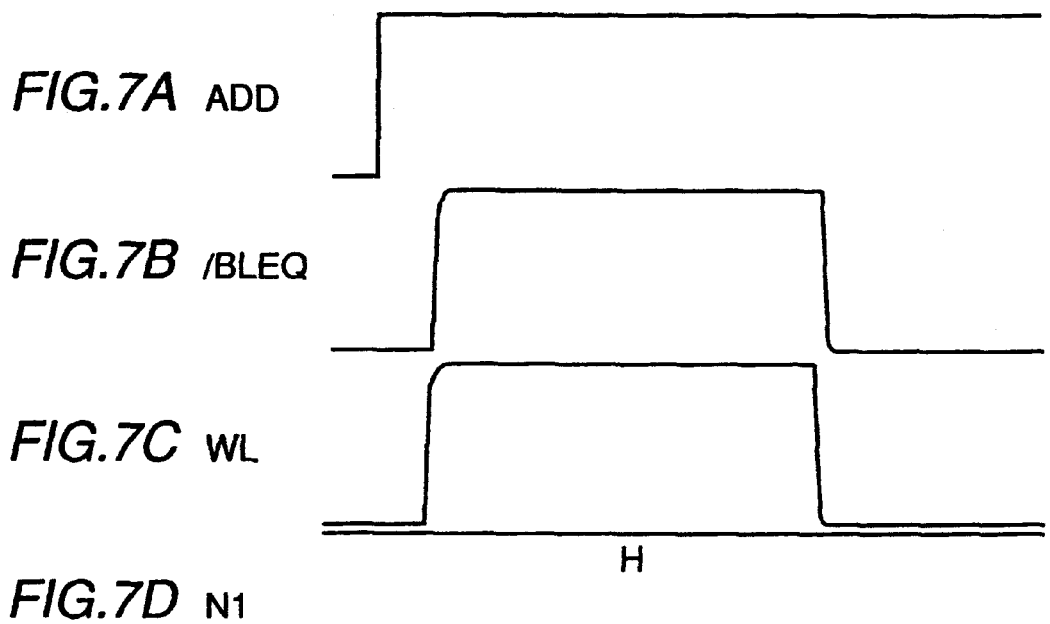
FIG.7D N1
FIG.7E N2
FIG.7F BL
FIG.7G /BL
FIG.7H SE1
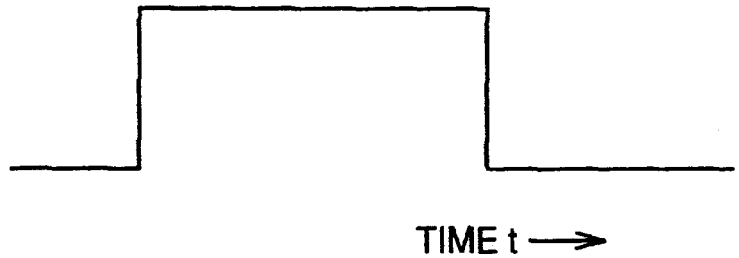
TIME t ⟶

STATIC TYPE SEMICONDUCTOR MEMORY DEVICE FOR LOWER CURRENT CONSUMPTION

BACKGROUND OF THE INVENTION

1. Field of the Invention

The present invention relates to static type semiconductor memory devices, and more particularly to a static type semiconductor memory device which includes a spare column to replace a defective column.

2. Description of the Background Art

In an SRAM which has a bit line and a line of a ground potential GND that are formed of the same interconnection layer, an extraneous object or defocusing brought about by the process of interconnection formation may short-circuit the bit line and the ground potential GND line. Since the bit line which is short-circuited with the ground potential GND line is fixed to a low level, a defective column which includes such a bit line cannot perform correct writing and reading operations.

Conventional SRAMs have been improved in the yield of chips by replacing such defective columns with normal spare columns.

However, even if such a defective column is replaced by a spare column, the conventional SRAM continues to flow current from a line of a power supply potential VCC through a bit line load and a defective bit line to a line of a ground potential GND, and increases current consumption.

Especially, recent lower power consumption type SRAMs excessively increase standby current even if a defective column as described above is replaced by a spare column, and thus the SRAMs become defective.

SUMMARY OF THE INVENTION

Therefore, a major object of the present invention is to provide a static type semiconductor memory device which consumes less current.

Briefly, a breaking circuit is provided which is arranged to correspond to each bit line pair and, in response to a corresponding bit line assuming a reference potential between first and second power supply potentials, breaks current flowing from a line of the first power supply potential through a corresponding bit line load to the bit line that has assumed the reference potential. Therefore, even if the bit line and a line of the second power supply potential are short-circuited, current leakage from the first power supply potential line through the bit line load and the bit line to the second power supply potential line can be prevented, and current consumption can be reduced.

Preferably, the breaking circuit includes a switching element provided to correspond to each bit line and connected in series with the bit line load between the line of the first power potential and one end of a corresponding bit line, and a potential detecting circuit provided to correspond to each bit line and rendering a corresponding switching element non-conductive in response to a corresponding bit line assuming a potential between the reference potential and the second power supply potential. In this case, only a bit line of the bit line pair which has assumed the potential between the reference potential and the second power supply potential is disconnected from the first power supply potential line.

Preferably, the switching element is a first transistor of a first conductivity type, and the potential detecting circuit includes an inverter having a second transistor of the first conductivity type and a third transistor of a second conductivity type which are connected in series between the lines of the first and second power supply potentials. In this case, the second and first transistors are rendered conductive and non-conductive, respectively, in response to the bit line assuming the potential between the reference potential and the second power supply potential.

Preferably, at least one diode element is further provided which is inserted between the line of the first power supply potential and a first electrode of the second transistor or between a first electrode of the third transistor and the second power supply potential line. In this case, the second and third transistors of the inverter are rendered conductive simultaneously, and through current can be prevented from flowing.

Preferably, the bit line load is a diode element having one electrode connected to the line of the first power supply potential and the other electrode connected to one end of a corresponding bit line through the first transistor, and the first electrode of the second transistor is connected to the other electrode of the diode element. In this case, the diode element which forms the bit line load also serves as a diode element for preventing through current, thus reducing the layout area.

Preferably, the breaking circuit includes a switching element provided to correspond to each bit line and connected in series with the bit line load between the line of the first power supply potential and one end of a corresponding bit line, and a potential detecting circuit to render a corresponding switching element non-conductive in response to at least one bit line of a corresponding bit line pair assuming a potential between the reference potential and the second power supply potential. In this case, the bit line pair is disconnected from the first power supply potential in response to at least one bit line of the bit line pair assuming the potential between the reference potential and the second power supply potential.

Preferably, the switching element is a first transistor of a first conductivity type, and the potential detecting circuit includes an NAND gate having second and third transistors of the first conductivity type connected in parallel between the line of the first power supply potential and an input electrode of the first transistor, and fourth and fifth transistors connected in series between a line of the second power supply potential and the input electrode of the first transistor. In this case, at least one of the second and third transistors is rendered conductive and the first transistor is rendered non-conductive in response to at least one bit line of the bit line pair assuming the potential between the reference potential and the second power supply potential.

Preferably, at least one diode element is further provided which is inserted between the line of the first power supply potential and first electrodes of the second and third transistors or between a first electrode of the fourth transistor and the line of the second power supply potential. In this case, the second to fifth transistors of the NAND gate are rendered conductive simultaneously, thus preventing the flow of through current.

Preferably, the bit line load is a diode element having one electrode connected to the line of the first power supply potential and the other electrode connected to one end of a corresponding bit line through the first transistor, and the first electrodes of the second and third transistors are connected to the other electrodes of the corresponding one and the other diode elements, respectively. In this case, the diode element which forms the bit line load also serves as a diode element for preventing through current, thus reducing the layout area.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A to 6I are timing charts showing the writing operation of the SRAM shown in FIGS. 1 to 5.

FIG. 7A to 7H are timing charts showing the reading operation of the SRAM shown in FIGS. 1 to 5.

DESCRIPTION OF THE PREFERRED EMBODIMENTS

First Embodiment

Figure 1:
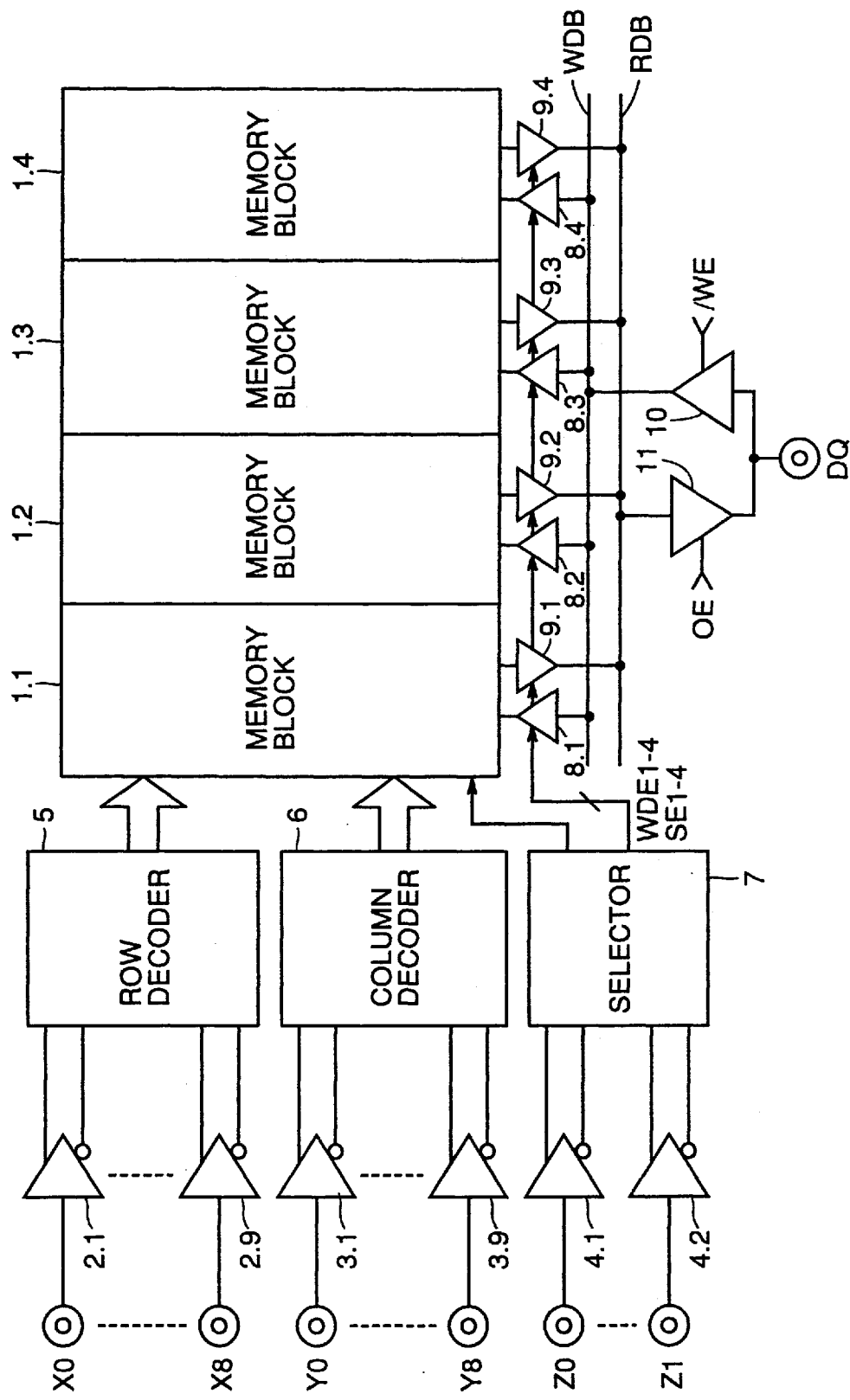
FIG. 1 is a block diagram showing the schematic structure of an SRAM according to a first embodiment of the present invention.

FIG. 1 is a block diagram showing the schematic structure of an SRAM according to a first embodiment of the present invention. In FIG. 1, the SRAM includes four memory blocks 1.1 to 1.4, address buffers 2.1 to 2.9, 3.1 to 3.9, 4.1, 4.2, a row decoder 5, a column decoder 6, a block selector 7, write drivers 8.1 to 8.4, sense amplifiers 9.1 to 9.4, an input buffer 10, and an output buffer 11.

Figure 2:
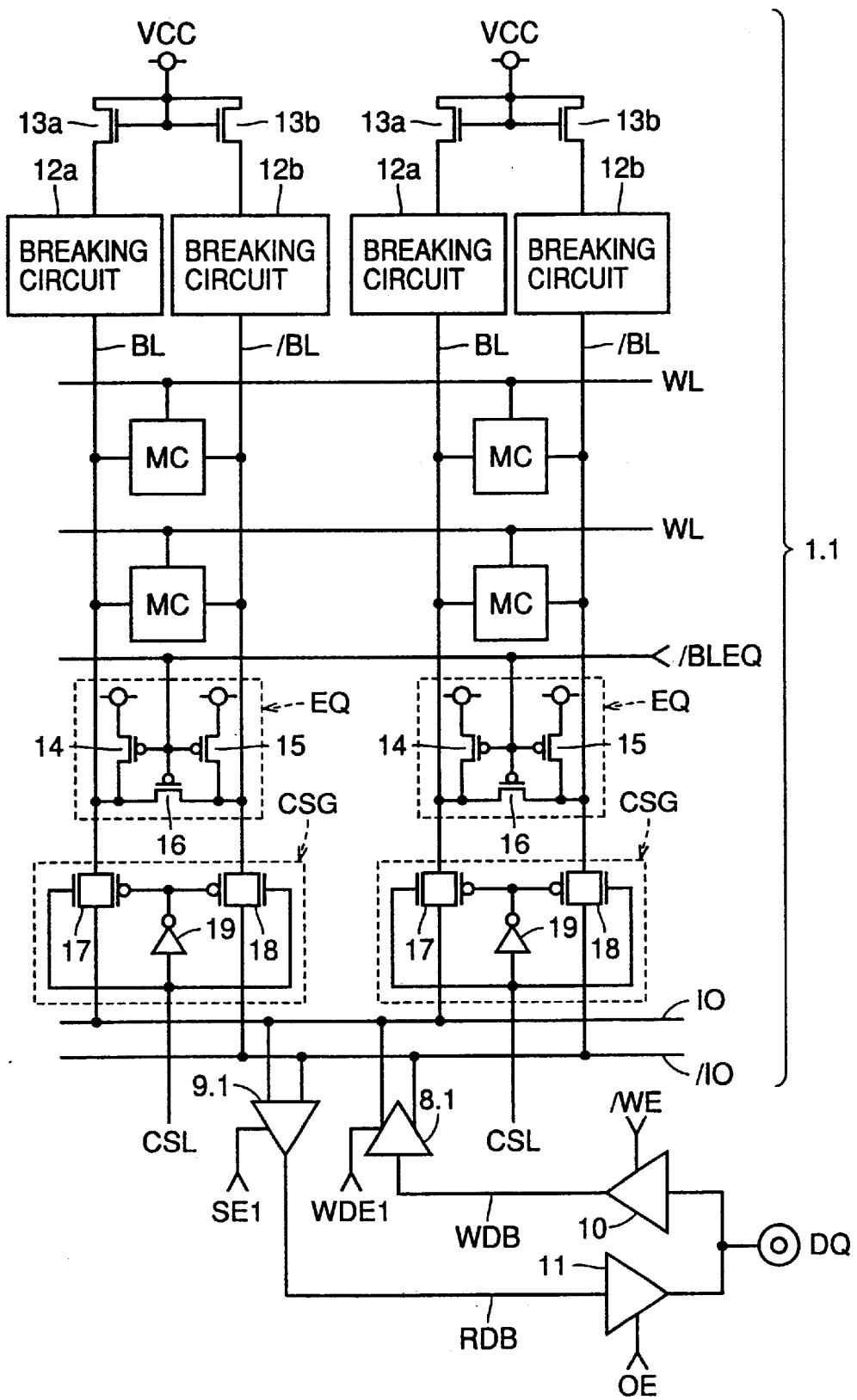
FIG. 2 is a circuit block diagram showing the structure of the memory block shown in FIG. 1.

As shown in FIG. 2, memory block 1.1 includes a plurality of (four in the figure) memory cells MC arranged in a plurality of rows and columns (for simplicity of the figure, they are two rows and two columns), a word line WL provided to correspond to each row, and a bit line pair BL, /BL provided to correspond to each column. Memory cells MC, word lines WL, and bit line pairs BL, /BL form a memory array.

Figure 3:
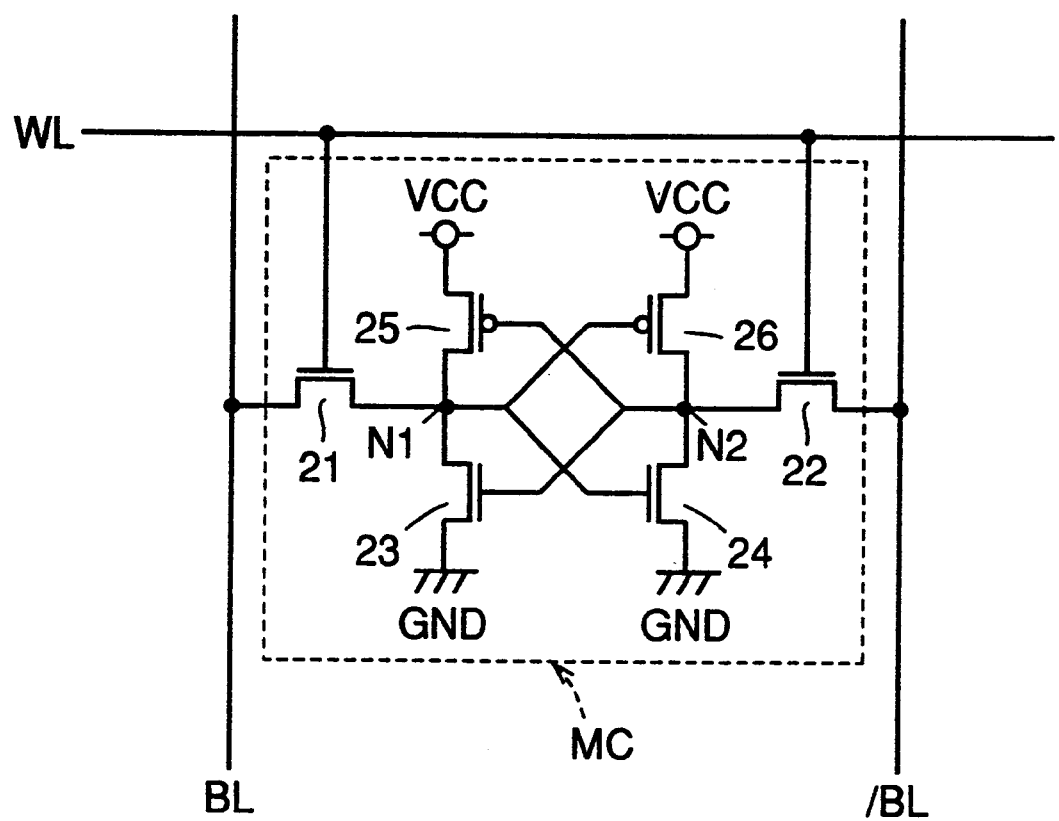
FIG. 3 is a circuit diagram showing the structure of the memory cell shown in FIG. 2.

As shown in FIG. 3, memory cell MC includes storage nodes N1, N2, N channel MOS transistors 21 to 24, and P channel MOS transistors 25, 26. N channel MOS transistors 21, 22 are connected between bit lines BL, /BL and storage nodes N1, N2, respectively, and each gate of the transistors is connected to word line WL. N channel MOS transistors 23, 24 are connected between storage nodes N1, N2 and a line of a ground potential GND, respectively, and each gate of the transistors is connected to storage nodes N2, N1, respectively. P channel MOS transistors 25, 26 are connected between a line of a power supply potential VCC and storage nodes N1, N2, respectively, and each gate of the transistors is connected to storage nodes N2, N1, respectively.

When word line WL is raised to the high level selected state, N channel MOS transistors 21, 22 are rendered conductive and memory cell MC is activated. During writing operation, when memory cell MC is activated and bit lines BL, /BL are set, for example, high and low, respectively, MOS transistors 24, 25 are rendered conductive and MOS transistors 23, 26 are rendered non-conductive, thus storing the high and low levels in storage nodes N1, N2, respectively. During reading operation, when bit lines BL, /BL are precharged to the high level and then memory MC is activated, column current flows from bit line /BL through N channel MOS transistors 22, 24 to the ground potential GND line and the potential of bit line /BL drops if storage nodes N1, N2 store the high and low levels, respectively. By comparing the potentials of bit lines BL, /BL, storage data can be read.

Referring back to FIG. 2, one ends of bit lines BL, /BL are connected to the power supply potential VCC line through breaking circuits 12a, 12b and N channel MOS transistors 13a, 13b, respectively. The gates of N channel MOS transistors 13a, 13b are both connected to the power supply potential VCC line. Each of N channel MOS transistors 13a, 13b is diode connected to form a bit line load.

Figure 4:
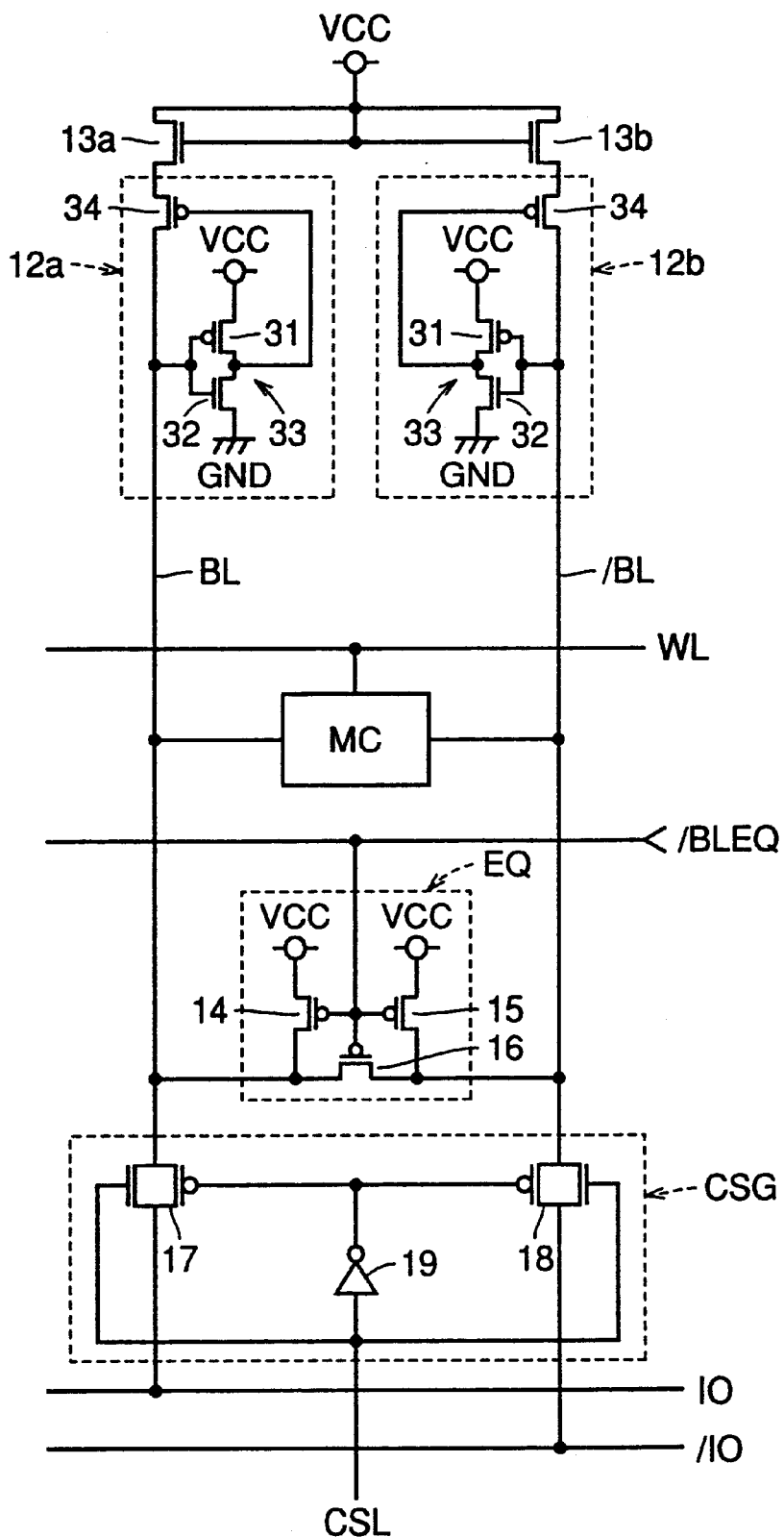
FIG. 4 is a circuit diagram showing the structure of the breaking circuit shown in FIG. 2.

As shown in FIG. 4, breaking circuit 12a includes an inverter 33 which has a P channel MOS transistor 31 and an N channel MOS transistor 32, and a P channel MOS transistor 34. P channel MOS transistor 34 is connected between the source of N channel MOS transistor 13a, which forms a bit line load, and one end of bit line BL. MOS transistors 31, 32 are connected in series between the power supply potential VCC line and the ground potential GND line, and have their gates connected to one end of bit line BL and their drains (the output node of inverter 33) connected to the gate of P channel MOS transistor 34.

When bit line BL is short-circuited with the ground potential GND line and thus driven low, inverter 33 outputs the high level and P channel MOS transistor 34 is rendered non-conductive. Thus, the power supply potential VCC line and bit line BL are disconnected, and current is prevented from leaking from the power supply potential VCC line through bit line load 13a and bit line BL to the ground potential GND line. Breaking circuit 12b is similar to breaking circuit 12a.

Referring back to FIG. 2, an equalizer EQ, a column selection gate CSG, and a column selection line CSL are provided to correspond to each bit line pair BL, /BL, and a data input/output line pair IO, /IO is provided to be shared by a plurality of bit line pairs BL, /BL.

Equalizer EQ includes P channel MOS transistors 14 to 16. P channel MOS transistors 14, 15 are connected between the power supply potential VCC line and bit lines BL, /BL, respectively, and P channel MOS transistor 16 is connected between bit lines BL, /BL. The gates of P channel MOS transistors 14 to 16 receive a bit line equalize signal /BLEQ. When signal /BLEQ is driven to the low level active state, P channel MOS transistors 14 to 16 are rendered conductive and bit lines BL, /BL are equalized to power supply potential VCC.

Column selection gate CSG includes transfer gates 17, 18 and an inverter 19. Transfer gates 17, 18 are connected between bit lines BL, /BL and data input/output lines IO, /IO, respectively. One end of column selection line CSL is connected to the gates of transfer gates 17, 18 on the N channel MOS transistor side, and also connected to the gates of transfer gates 17, 18 on the P channel MOS transistor side through inverter 19. When column selection line CSL is raised to the high level selected state, transfer gates 17, 18 are rendered conductive and bit lines BL, /BL are connected to data input/output lines IO, /IO. Each of other memory blocks 1.2 to 1.4 has the same structure as memory block 1.1.

It is noted that the "divided word line scheme" is employed in the SRAM and that only word lines WL of one memory block of four memory blocks 1.1 to 1.4 which is selected by a selector 7 become selectable.

Figure 5:
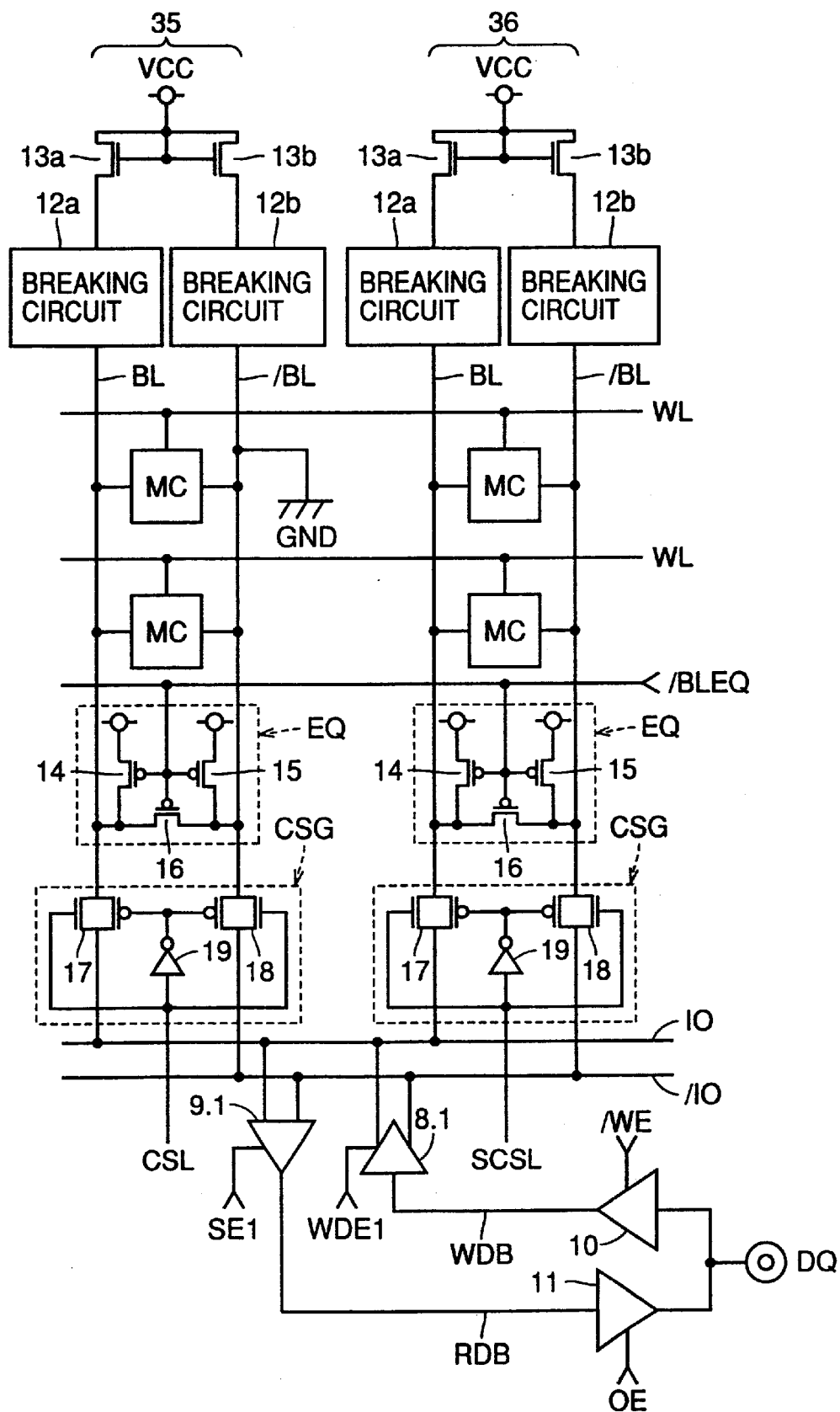
FIG. 5 is a circuit block diagram showing a spare column included in the SRAM shown in FIG. 1.

As shown in FIG. 5, a spare column 36 which has the same structure as a normal column 35 shown in FIG. 2 is provided for each of or to be shared by memory blocks 1.1 to 1.4. When bit line /BL of normal column 35, for example, is short-circuited with the ground potential GND line and thus defective, normal column 35 is replaced by spare column 36.

Referring back to FIG. 1, address buffers 2.1 to 2.9 produce amplified signals and inverted amplified signals of external address signals X0 to X8, respectively, and supply the signals to row decoder 5. Address buffers 3.1 to 3.9 produce amplified signals and inverted amplified signals of external address signals Y0 to Y8, respectively, and supply the signals to column decoder 6. Address buffers 4.1, 4.2 produce amplified signals and inverted amplified signals of external address signals Z0, Z1, and supply the signals to block selector 7.

According to the signals from address buffers 2.1 to 2.9, row decoder 5 selects one word line WL of a plurality of word lines WL of a memory block selected by selector 7, sets selected word line WL to the high level selected state, and activates memory cell MC.

According to the signals from address buffers 3.1 to 3.9, column decoder 6 selects one column selection line CSL of a plurality of column selection lines of memory blocks 1.1 to 1.4, sets selected column selection line CSL to the high level selected state, and couples bit line pair BL, /BL corresponding to that column selection line CSL to data input/output line pair IO, /IO.

Column decoder 6 is provided with a program circuit for programming the address of a defective column. If a programmed address is input, a spare column selection line SCSL of spare column 36 is selected instead of column selection line CSL of the defective column, and bit line pair BL, /BL of spare column 36 are coupled, instead of bit line pair BL, /BL of the defective column, to data input/output line pair IO, /IO.

According to the signals from address buffers 4.1, 4.2, block selector 7 selects one memory block of four memory blocks 1.1 to 1.4, and makes word lines WL of the memory block selectable.

During writing operation, block selector 7 sets one signal of four write driver activation signals WDE1 to WDE4 to the high level active state and activates one write driver of four write drivers 8.1 to 8.4 according to the signals from address buffers 4.1, 4.2.

During reading operation, block selector 7 sets one signal of four sense amplifier activation signals SE1 to SE4 to the high level active state and activates one sense amplifier of four sense amplifiers 9.1 to 9.4 according to the signals from address buffers 4.1, 4.2.

Write drivers 8.1 to 8.4 are provided to correspond to memory blocks 1.1 to 1.4. Sense amplifiers 9.1 to 9.4 are provided to correspond to memory blocks 1.1 to 1.4. A write data bus WDB and a read data bus RDB are provided to be shared by four memory blocks 1.1 to 1.4.

Input buffer 10 is activated when an write enable signal /WE is at the low level active state, sets write data bus WDB high or low according to external data D. Input buffer 10 is formed of a tristate buffer, and its output node assumes a high impedance state when write enable signal /WE is at the high level inactive state. Write drivers 8.1 to 8.4 are activated when write driver activation signals WDE1 to WDE4 are at the high level active state, set one and the other data input/output lines IO, /IO of memory blocks 1.1 to 1.4 high and low, according to the level of write data bus WDB, and write data to activated memory cell MC through selected bit line pair BL, /BL.

Sense amplifiers 9.1 to 9.4 are activated when sense amplifier activation signals SE1 to SE4 are at the high level active state, compare the potentials of data input/output lines IO, /IO of memory blocks 1.1 to 1.4, and set read data bus RDB high or low according to the comparison result. Output buffer 11 is activated when output enable signal OE is at the high level active state, and externally outputs a signal of a level which corresponds to the level of read data bus RDB, that is, read data Q. Output buffer 11 is formed of a tristate buffer, and its output node assumes a high impedance state when output enable signal OE is at the low level inactive state.

FIGS. 6A to 6I are timing charts showing the writing operation of the SRAM shown in FIGS. 1 to 5. First, external address signals ADD (X0 to X8, Y0 to Y8, Z0, Z1) and external data D are input, and write enable signal /WE attains the low level active state. In response, one column selection line CSL of a plurality of column selection lines of memory blocks is set to the high level selected state by column decoder 6, and bit line pair BL, /BL corresponding to that column selection line CSL are connected to data input/output line pair IO, /IO. Furthermore, one memory block of four memory blocks 1.1 to 1.4 is selected by block selector 7, thus making word lines WL of the memory block selectable.

Bit line equalize signal /BLEQ is kept at the low level active state for a prescribed time period, P channel MOS transistors 14 to 16 of each equalizer EQ are rendered conductive, and each bit line pair BL, /BL and data input/ output line pair IO, /IO are equalized to the high level. At this time, inverters 33 of breaking circuits 12a, 12b output the low level and P channel MOS transistors 34 are conductive. Furthermore, input buffer 10 drives write data bus WDB high or low according to input data D.

Then, block selector 7 drives signal WDE1, for example, of four driver activation signals WDE1 to WDE4 to the high level active state. Thus, write driver 8.1 is activated, bit line BL, for example, of bit line pair BL, /BL selected by column decoder 6 is driven high, and bit line /BL is driven low. At this time, inverter 33 of breaking circuit 12b outputs the high level and P channel MOS transistor 34 is non-conductive. Although bit line /BL is disconnected from bit line load 13b, the writing operation is not affected.

Then, row decoder 5 drives one word line WL of a plurality of selectable word lines WL to the high level selected state. Thus, N channel MOS transistors 21, 22 of memory cell MC corresponding to that word line WL are rendered conductive, and storage nodes N1, N2 are driven high and low, respectively.

Thereafter, write driver activation signal WDE1 is driven to the low level inactive state, thus inactivating write driver 8.1, word line WL is driven to the low level non-selected state, thus inactivating memory cell MC, signal /BLEQ is driven to the low level active state, thus equalizing each bit line pair BL, /BL, and write enable signal WE is driven to the high level inactive state, thus inactivating input buffer 10. Data writing is completed in this manner.

FIGS. 7A to 7H are flow charts showing the reading operation of the SRAM. First, external address signals ADD are input, one column selection line CSL of a plurality of column selection lines CSL of memory blocks is driven to the high level selected state by column decoder 6, and bit line pair BL, /BL corresponding to that column selection line CSL are connected to data input/output line pair IO, /IO. At this time, signal /BLEQ is at the low level active state and each bit line pair BL, /BL is equalized to the high level. Furthermore, one memory block of four memory blocks 1.1 to 1.4 is selected by block selector 7, and word lines WL of the memory block are made selectable.

Then, signal /BLEQ is driven to the high level inactive state, thus stopping equalization of bit line pair BL, /BL, one word line WL of a plurality of selectable word lines WL is driven to the high level selected state by row decoder 5, and N channel MOS transistors 21, 22 of memory cell MC corresponding to that word line WL are rendered conductive.

Suppose that storage nodes N1, N2, for example, store the high and low levels, respectively, then column current flows from bit line /BL through N channel MOS transistors 22, 24 of that memory cell MC to the ground potential GND line, and thus the potential of bit line /BL drops.

At this time, even if the potential of bit line /BL drops to the low level, inverter 33 of breaking circuit 12b outputs the high level, P channel MOS transistor 34 is rendered non-conductive, and bit line /BL is disconnected from bit line load 13b, the potential difference between bit lines BL, /BL has increased to such an extent that the potential difference can be detected by sense amplifier 9.1. Therefore, the reading operation is not affected at all.

Then, a signal SE1, for example, of four sense amplifier activation signals is driven to the high level active state by block selector 7, and sense amplifier 9.1 is activated. Sense amplifier 9.1 compares the potentials of bit lines BL, /BL selected by column decoder 6, that is, the potentials of data input/output lines IO, /IO, and outputs to read data bus RDB a signal of a level which corresponds to the comparison result. When output enable signal OE attains the high level active state, the level of read data bus RDB, that is, read data Q is externally output through output buffer 11.

If defective column 35 shown in FIG. 5 has been replaced by spare column 36, the writing and reading operations are performed similarly except that a spare column selection line SCSL of spare column 36 is selected instead of column selection line CSL of defective column 35.

At this time, if bit line /BL of defective column 35 is short-circuited with the ground potential GND line, then inverter 33 of breaking circuit 12b outputs the high level, P channel MOS transistor 34 is rendered non-conductive, and bit line /BL is disconnected from bit line load 13. Therefore, current is prevented from leaking from the power supply potential VCC line through bit line load 13b and bit line /BL to the ground potential GND line, and the SRAM is prevented from being inferior with respect to standby current and becoming defective.

Figure 8:
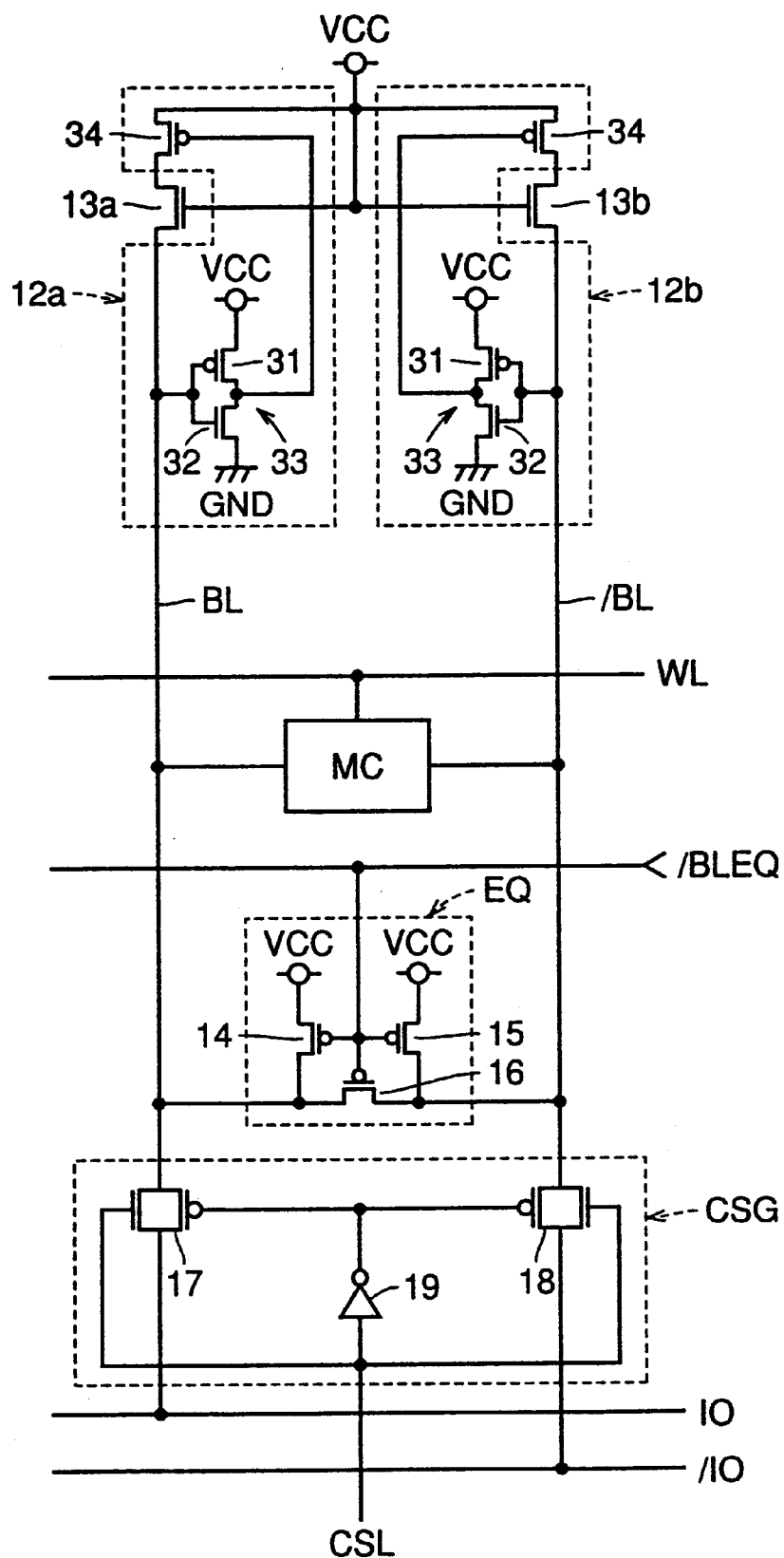
FIG. 8 is a circuit diagram showing a modification of the first embodiment.
Figure 9:
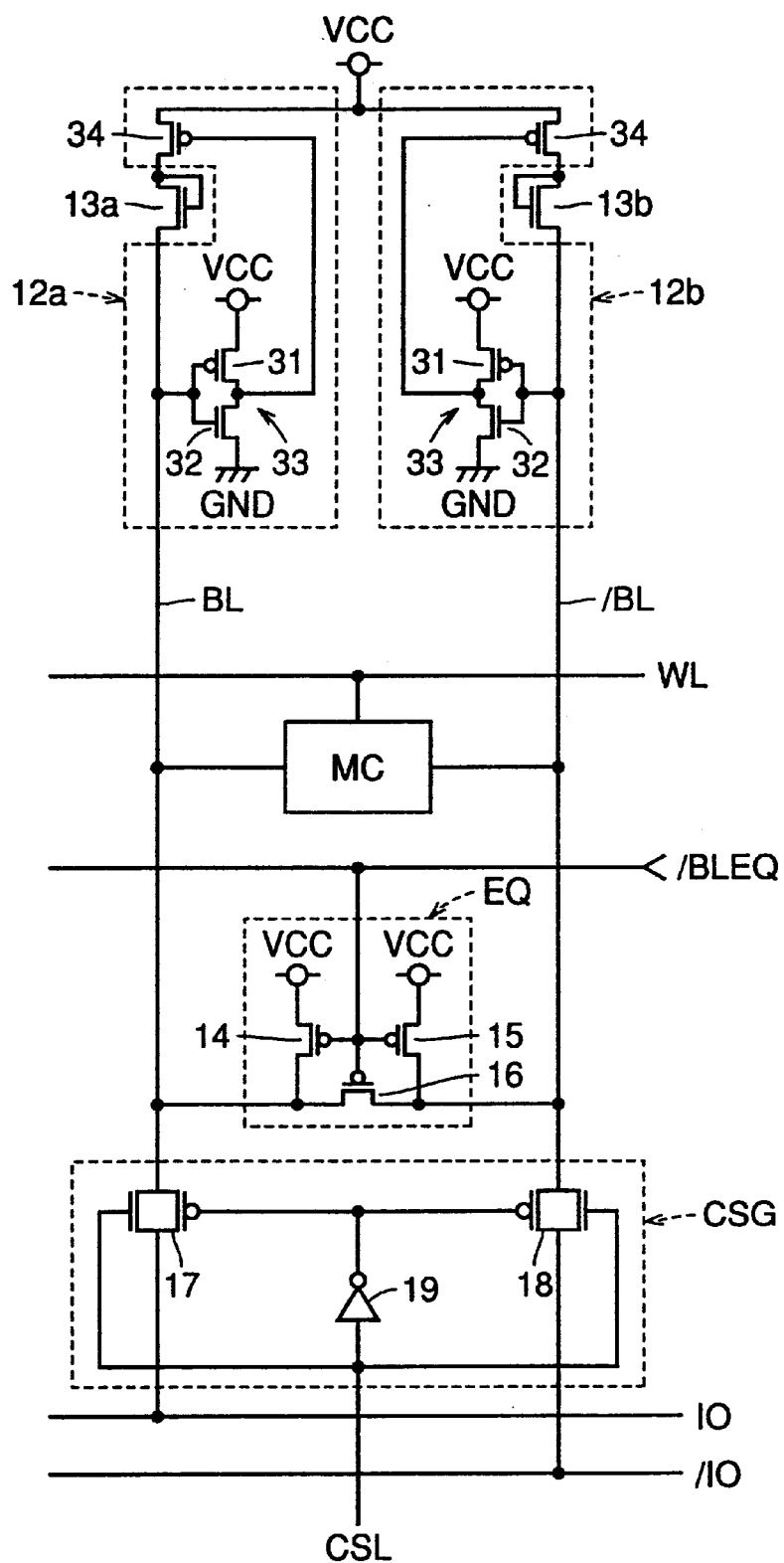
FIG. 9 is a circuit block diagram showing another modification of the first embodiment.

As shown in FIG. 8, P channel MOS transistors 34 of breaking circuits 12a, 12b may be connected between the gates and drains of N channel MOS transistors 13a, 13b. As shown in FIG. 9, P channel MOS transistors 34 of breaking circuits 12a, 12b may be connected between the power supply potential VCC line and the gates and drains of P channel MOS transistors 13a, 13b.

Figure 10:
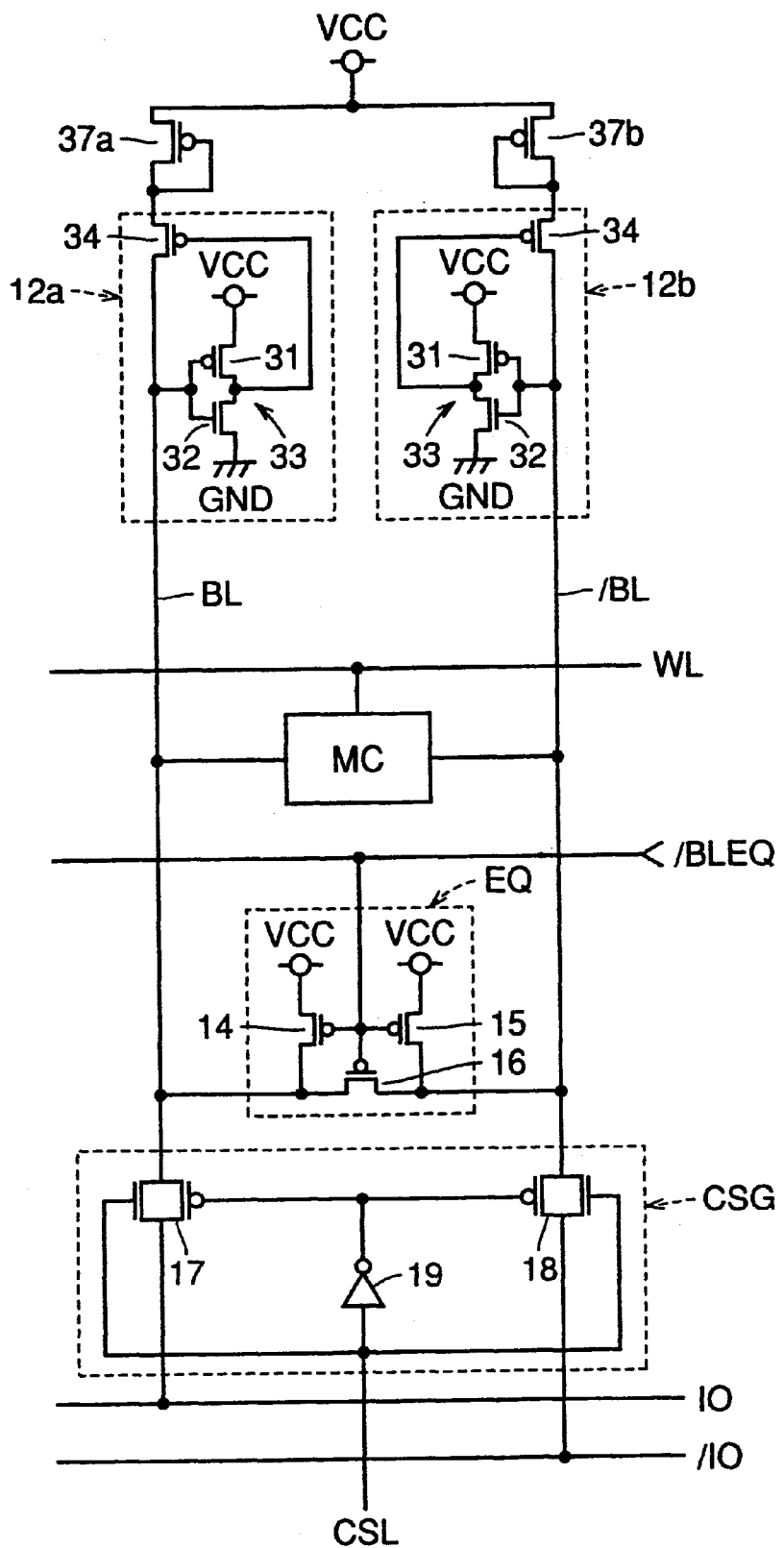
FIG. 10 is a circuit block diagram showing still another modification of the first embodiment.
Figure 11:
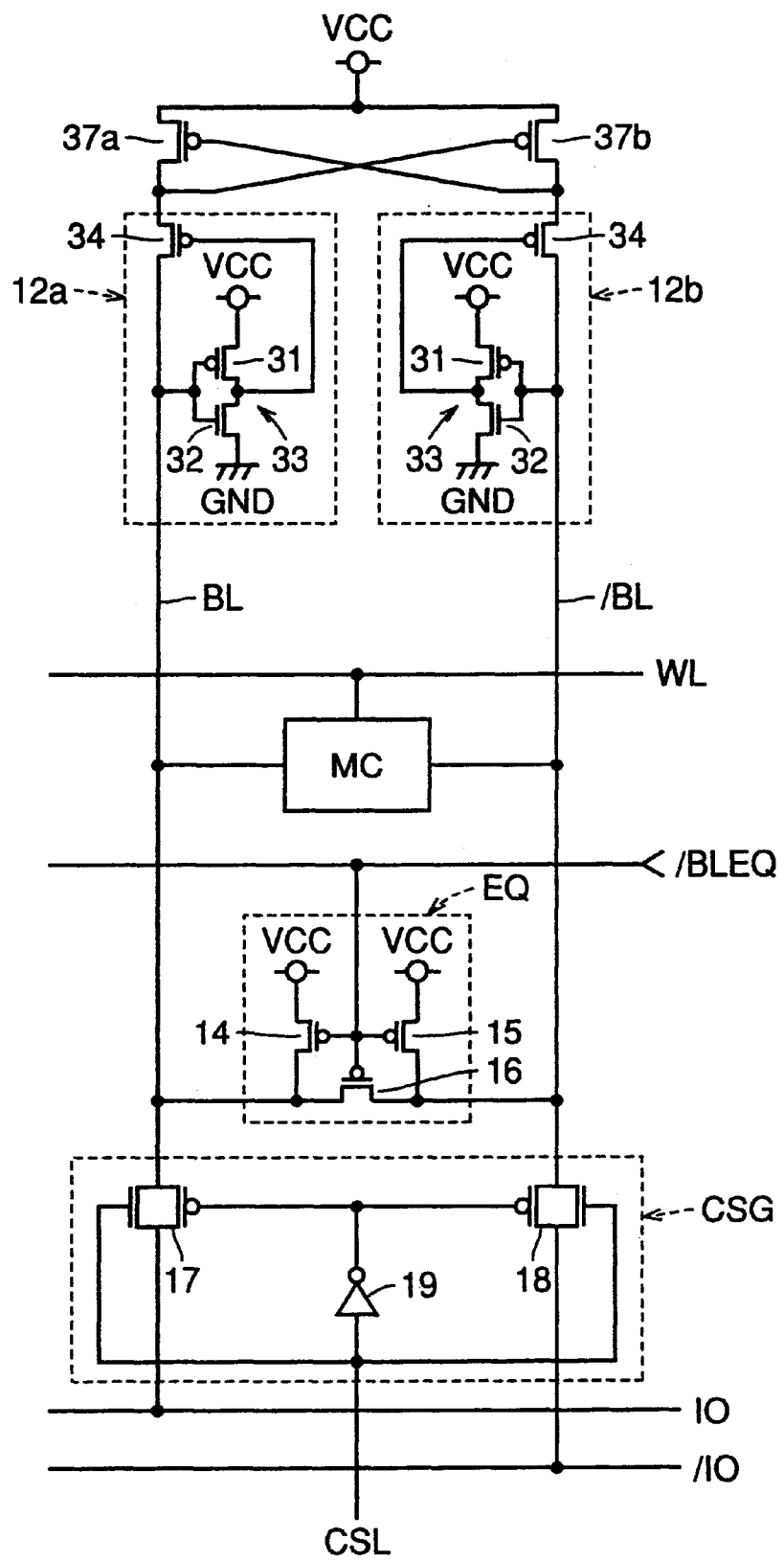
FIG. 11 is a circuit block diagram showing still another modification of the first embodiment.

As shown in FIG. 10, N channel MOS transistors 37a, 37b may substitute N channel MOS transistors 13a, 13b. P channel MOS transistors 37a, 37b may be diode-connected and, as shown in FIG. 11, may have their gates connected to the drains of P channel MOS transistors 37b, 37a, respectively.

Second Embodiment

Figure 12A:
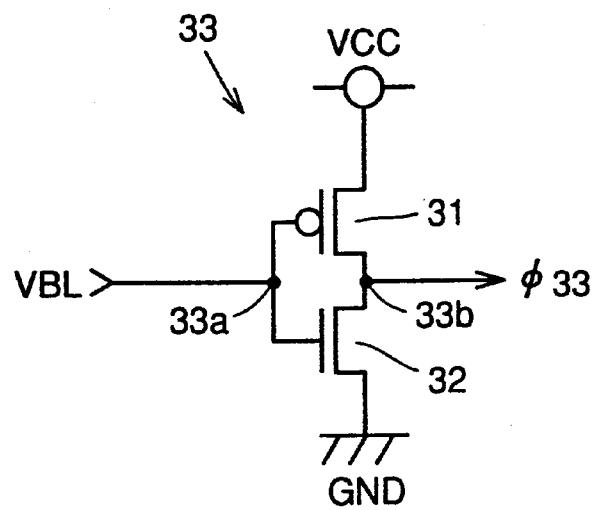
FIGS. 12A and 12B are views for illustrating problems with the SRAM in the first embodiment.
Figure 12B:
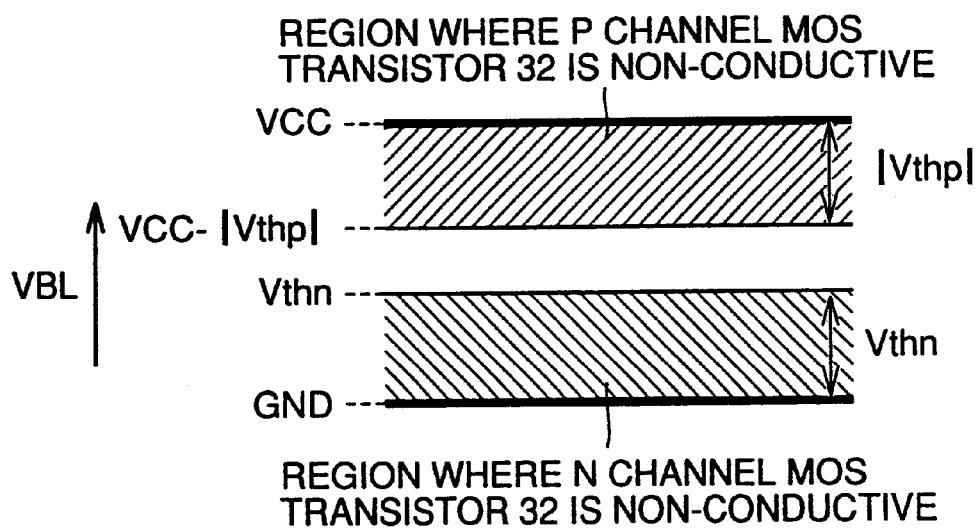

FIG. 12A is a circuit diagram showing the structure of inverters 33 included in delay circuits 12a, 12b shown in FIG. 4, and FIG. 12B illustrates the operation of inverter 33.

In FIGS. 12A and 12B, inverter 33 includes P channel MOS transistor 31 and N channel MOS transistor 32. P channel MOS transistor 31 is connected between the power supply potential VCC line and an output node 33b, and has its gate connected to an input node 33a. N channel MOS transistor 32 is connected between output node 33b and the ground potential GND line, and has its gate connected to input node 33a. Input node 33a receives the potential VBL of bit line BL or /BL, and output node 33b outputs a signal φ33.

Suppose that, during reading operation, bit line BL or /BL is precharged to the high level (power supply potential VCC), and then gradually pulled down to the low level (ground potential GND) by a memory cell MC. While bit line potential VBL is VCC~VCC-Vthp (here, Vthp is the threshold voltage of P channel MOS transistor 31), P channel MOS transistor 31 is non-conductive, N channel MOS transistor 32 is conductive, and signal φ33 is low.

While bit line potential VBL is VCC-Vthp~Vthn (here, Vthn is the threshold voltage of N channel MOS transistor 32), P channel MOS transistor 31 and N channel MOS transistor 32 are conductive, and through current flows from the potential VCC line to the ground potential GND line. While bit line potential VBL is Vthn~GND, P channel MOS transistor 31 is conductive, N channel MOS transistor 32 is non-conductive, and signal φ33 is high.

Therefore, it is considered that provision of breaking circuits 12a, 12b for bit lines BL, /BL produces through current in breaking circuits 12a, 12b and increases SRAM current consumption. The problems are solved in this embodiment.

Figure 13:
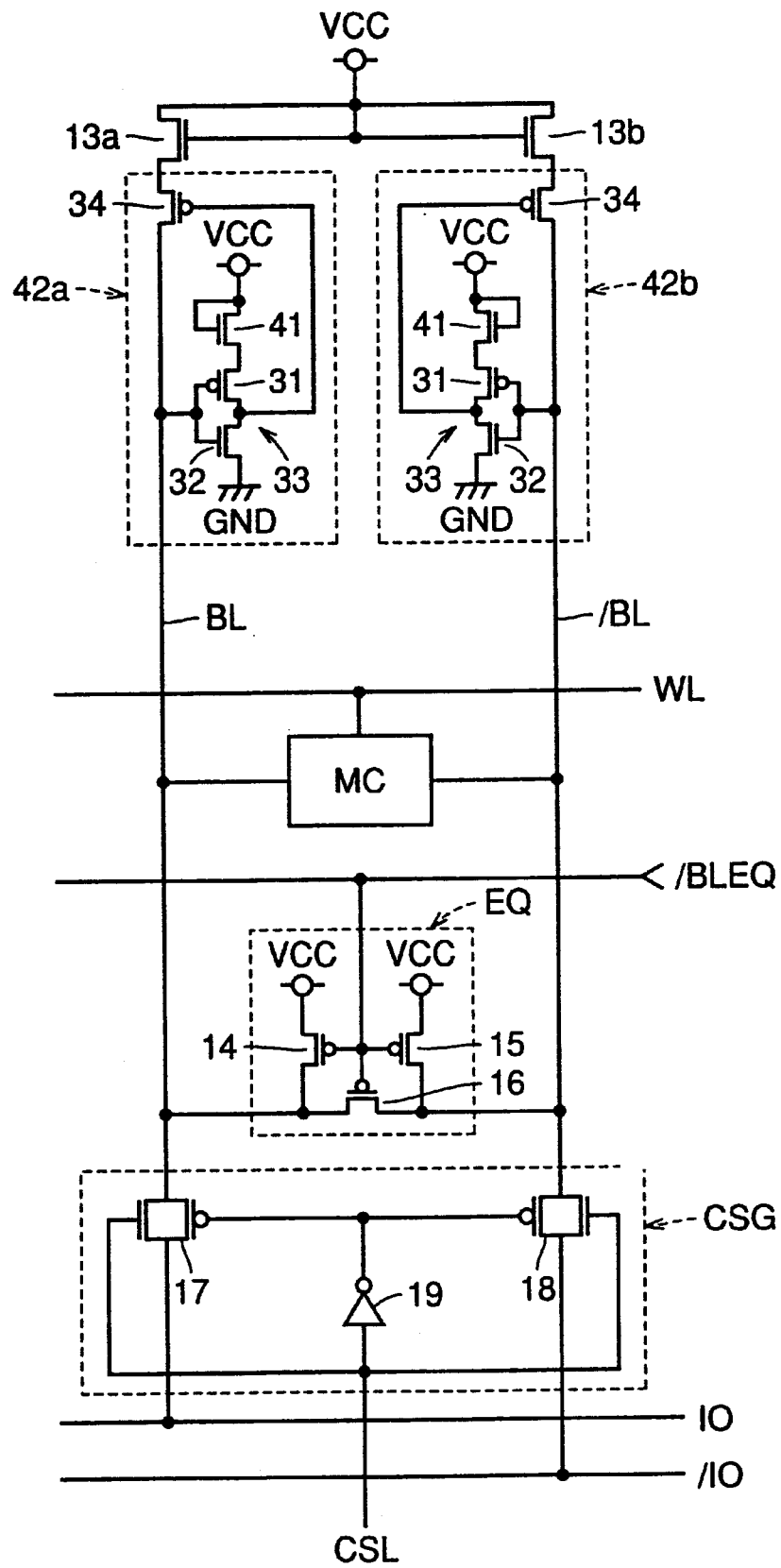
FIG. 13 is a circuit block diagram showing a main part of an SRAM according to a second embodiment of the present invention.

FIG. 13, corresponding to FIG. 4, shows a main part of an SRAM according to the second embodiment.

Referring to FIG. 13, the SRAM includes breaking circuits 42a, 42b between the sources of N channel MOS transistors 13a, 13b and one ends of bit lines BL, /BL. Breaking circuits 42a, 42b are different from breaking circuits 12a, 12b of FIG. 4 in that an N channel MOS transistor 41 is added. N channel MOS transistor 41 is connected between the power supply potential VCC line and the source of P channel MOS transistor 31, and has its gate connected to the power supply potential VCC line. N channel MOS transistor 41 has the same threshold voltage Vth as N channel MOS transistor 32 and operates as a diode.

Figure 14A:
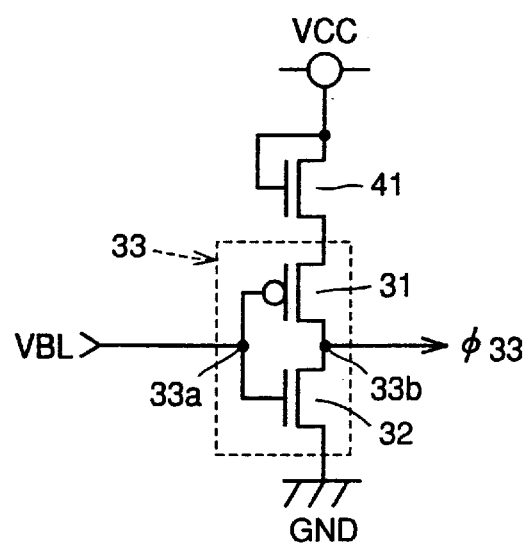
FIGS. 14A and 14B are views for illustrating the effects of the SRAM shown in FIG. 13.
Figure 14B:
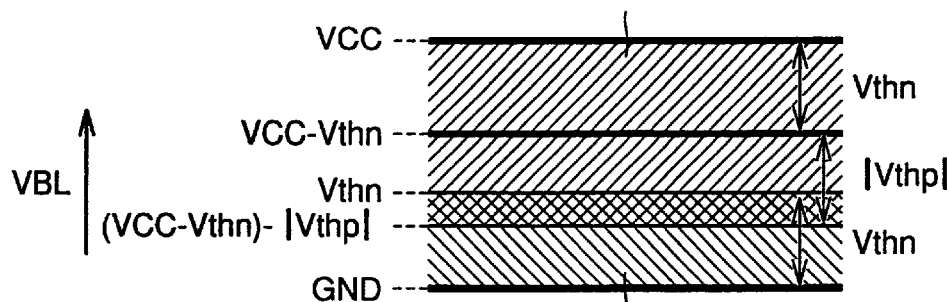

FIGS. 14A and 14B, corresponding to FIGS. 12A and 12B, show the operation of inverters 33 in breaking circuits 42a, 42b.

Suppose that, during reading operation, bit line BL or /BL is precharged to the high level, and then gradually pulled down to the low level by memory cell MC. While bit line potential VBL is VCC~Vthn, P channel MOS transistor 31 is non-conductive, N channel MOS transistor 32 is conductive, and signal φ33 is low. At this time, P channel MOS transistor 34 is conductive, and bit lines BL, /BL are connected to the power supply potential VCC line through P channel MOS transistors 34, 34 and N channel MOS transistors 13a, 13b, respectively. While bit line potential VBL is Vthn~VCC–Vthn–Vthp, P channel MOS transistor 31 and N channel MOS transistor 32 are both non-conductive. At this time, signal φ33 is kept low and P channel MOS transistor 34 is conductive.

While bit line potential VBL is VCC–Vthn–Vthp~GND, P channel MOS transistor 31 is conductive, N channel MOS transistor 32 is nonconductive, and signal φ33 is low. At this time, P channel MOS transistor 34 is non-conductive, and bit lines BL, /BL are disconnected from the power supply potential VCC line.

In breaking circuits 42a, 42b, therefore, P channel MOS transistor 31 and N channel MOS transistor 32 of inverter 33 are not rendered conductive simultaneously, and thus through current does not flow in inverter 33. Therefore, this embodiment can attain the same effects as the first embodiment and prevent the increase in SRAM operating current.

In this embodiment, the diode element for preventing through current (N channel MOS transistor 41) is connected between the power supply potential VCC line and the source of P channel MOS transistor 31. However, the diode element for preventing through current may be connected between the source of N channel MOS transistor 32 and the ground potential GND line. Furthermore, a plurality of diode elements which are connected in series may be used. In addition, a P channel MOS transistor which has its gate and drain connected may form the diode element.

Figure 15:
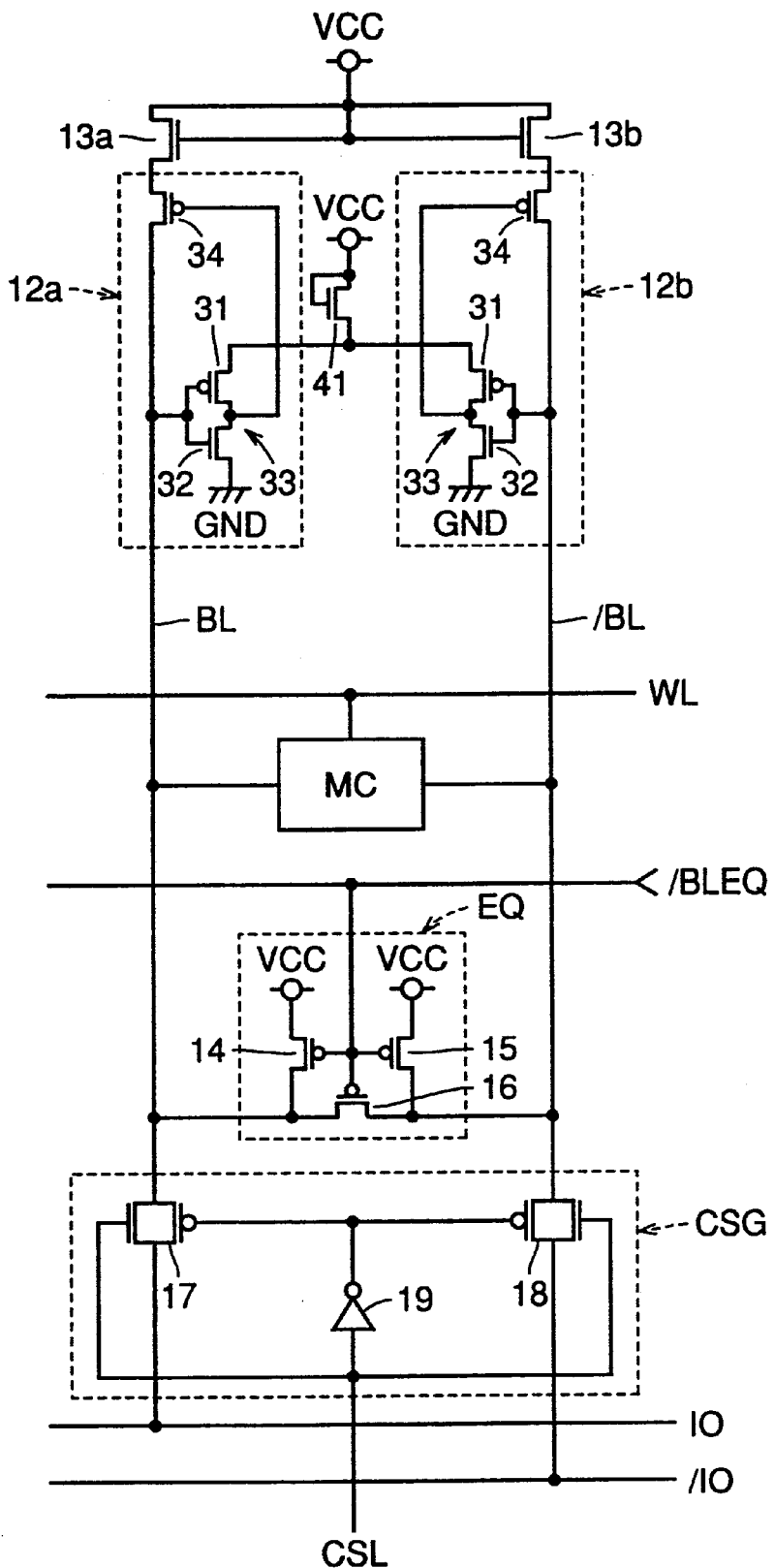
FIG. 15 is a circuit block diagram showing a modification of the second embodiment.

As shown in FIG. 15, N channel MOS transistor 41 may be provided to be shared by breaking circuits 12a, 12b. N channel MOS transistor 41 is diode-connected between the power supply potential VCC line and the sources of P channel MOS transistors 31 of breaking circuits 12a, 12b. It is noted that the diode element for preventing through current v channel MOS transistor 41) may be provided to be share not only by two breaking circuits 12a, 12b in one column but also by multiple pairs of breaking circuits 12a, 12b in a plurality of columns.

Figure 16:
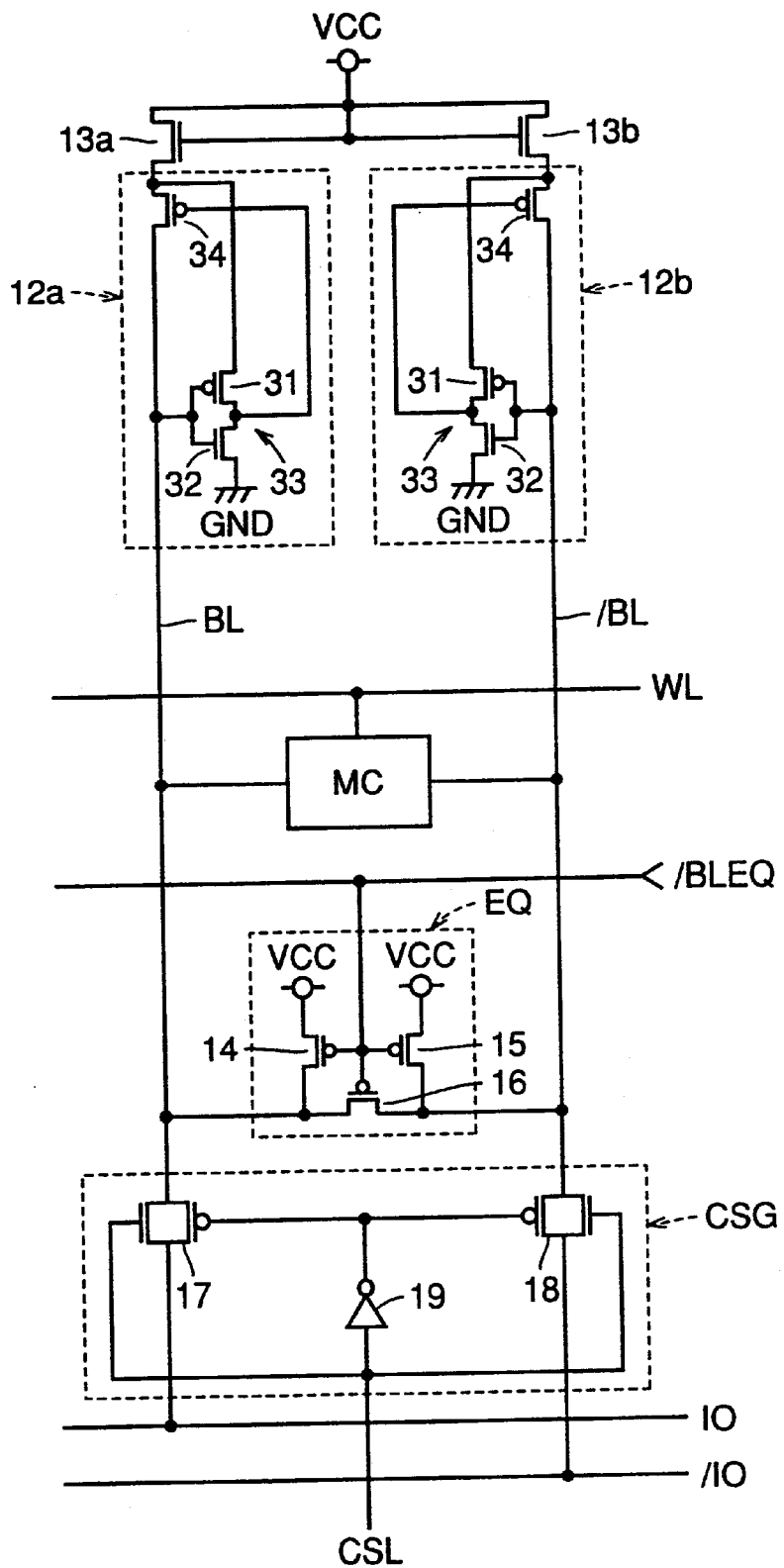
FIG. 16 is a circuit block diagram showing another modification of the second embodiment.

As shown in FIG. 16, the sources of P channel MOS transistors 31 of breaking circuits 12a, 12b may be connected to the sources of N channel MOS transistors 13a, 13b, respectively. In this case, each of N channel MOS transistors 13a, 13b also functions as an N channel MOS transistor for preventing through current. Therefore, N channel MOS transistor 41 for preventing through current does not have to be provided separately, and thus the layout area can be reduced.

Third Embodiment

Figure 17:
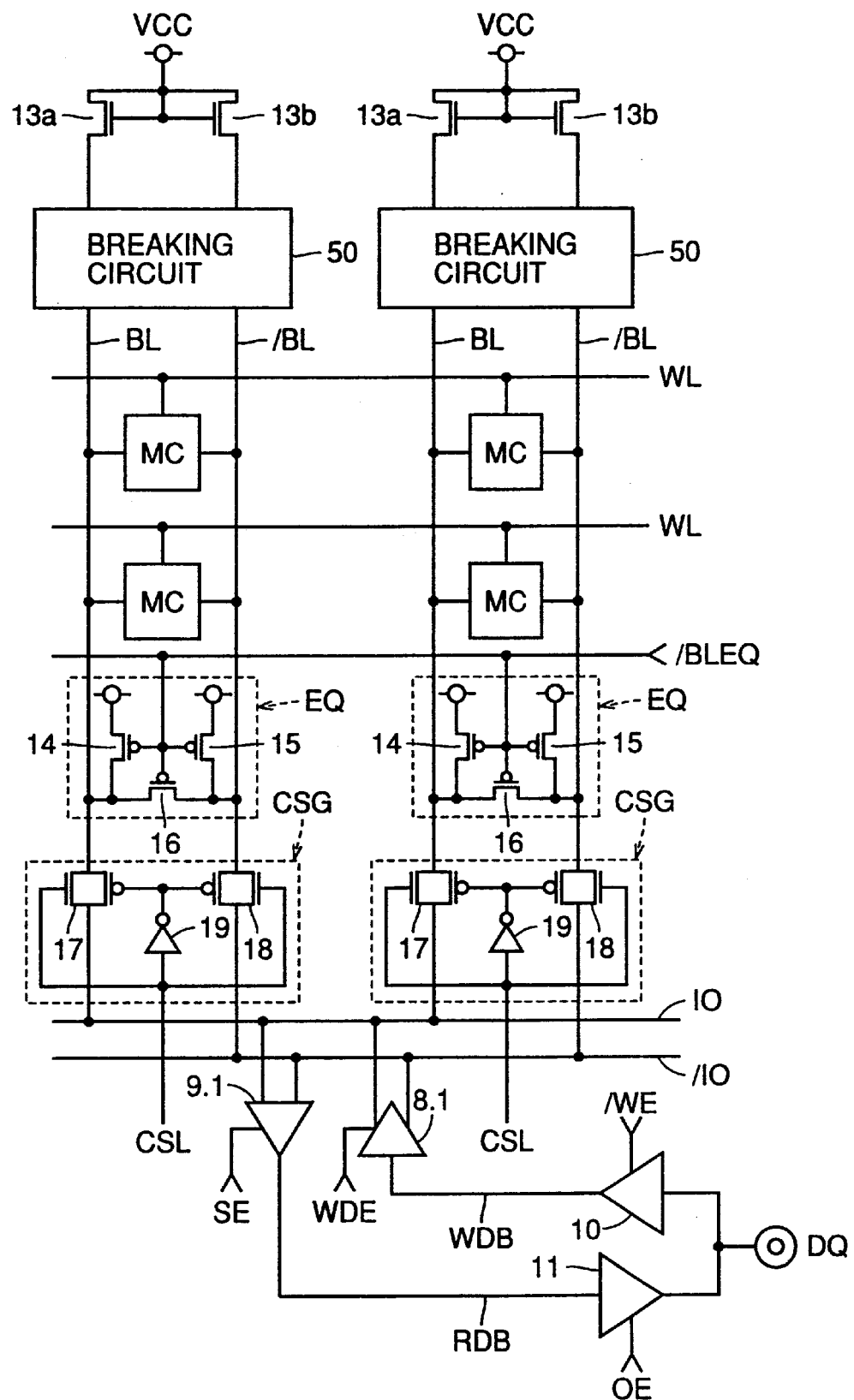
FIG. 17 is a circuit block diagram showing a main part of an SRAM according to a third embodiment of the present invention.

FIG. 17, corresponding to FIG. 2, is a circuit block diagram showing a main part of an SRAM according to a third embodiment of the present invention. In FIG. 17, the SRAM includes a breaking circuit 50 to correspond to each bit line pair BL, /BL.

Figure 18:
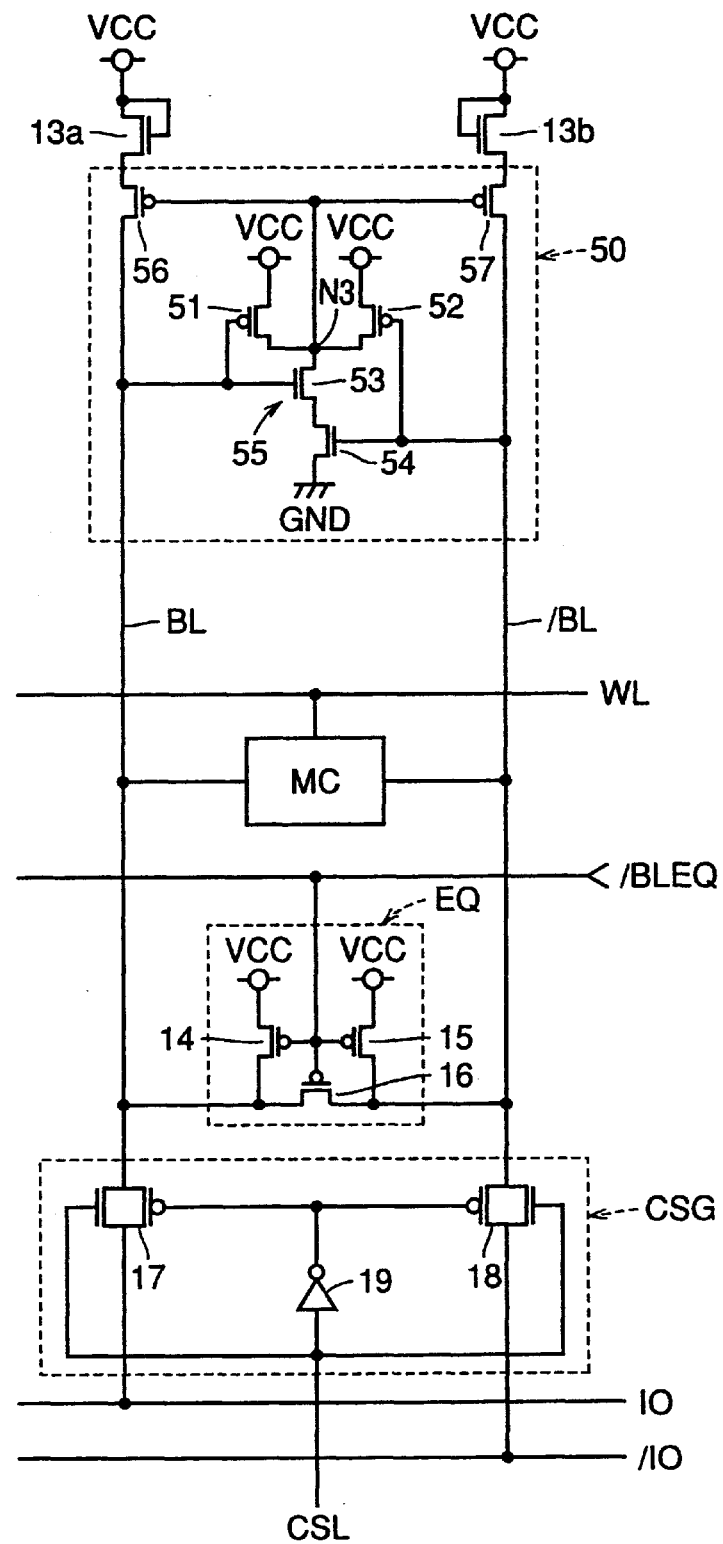
FIG. 18 is a circuit diagram showing the structure of the breaking circuit shown in FIG. 17.

As shown in FIG. 18, breaking circuit 50 includes a two-input NAND gate 55 which has P channel MOS transistors 51, 52 and N channel MOS transistors 53, 54, and P channel MOS transistors 56, 57. P channel MOS transistors 51, 52 are connected in parallel between the power supply potential VCC line and an output node N3, and N channel MOS transistors 53, 54 are connected in series between output node N3 and the ground potential GND line. MOS transistors 51, 53 have their gates connected to one end of bit line BL, and MOS transistors 52, 54 have their gates connected to one end of bit line /BL.

When bit lines BL, /BL are both high, P channel MOS transistors 51, 52 are non-conductive, N channel MOS transistors 53, 54 are conductive, and output node N3 is low. When at least one of bit lines BL, /BL is low, at least one of P channel MOS transistors 51, 52 is conductive, at least one of N channel MOS transistors 53, 54 is non-conductive, and output node N3 is high.

P channel MOS transistors 56, 57 are connected between one ends of bit lines BL, /BL and the sources of N channel MOS transistors 13a, 13b, and have their gates connected to output node N3 of NAND gate 55.

Therefore, when at least one of bit lines BL, /BL is short-circuited with the ground potential GND line, NAND gate 55 outputs the high level, P channel MOS transistors 56, 57 are non-conductive, and bit lines BL, /BL are disconnected from the sources of N channel MOS transistors 13a, 13b. Therefore, current is prevented from leaking from the power supply potential VCC line through N channel MOS transistors 13a, 13b and defective bit lines BL, /BL to the ground potential GND line, and the SRAM is prevented from being inferior with respect to standby current and becoming defective.

Figure 19:
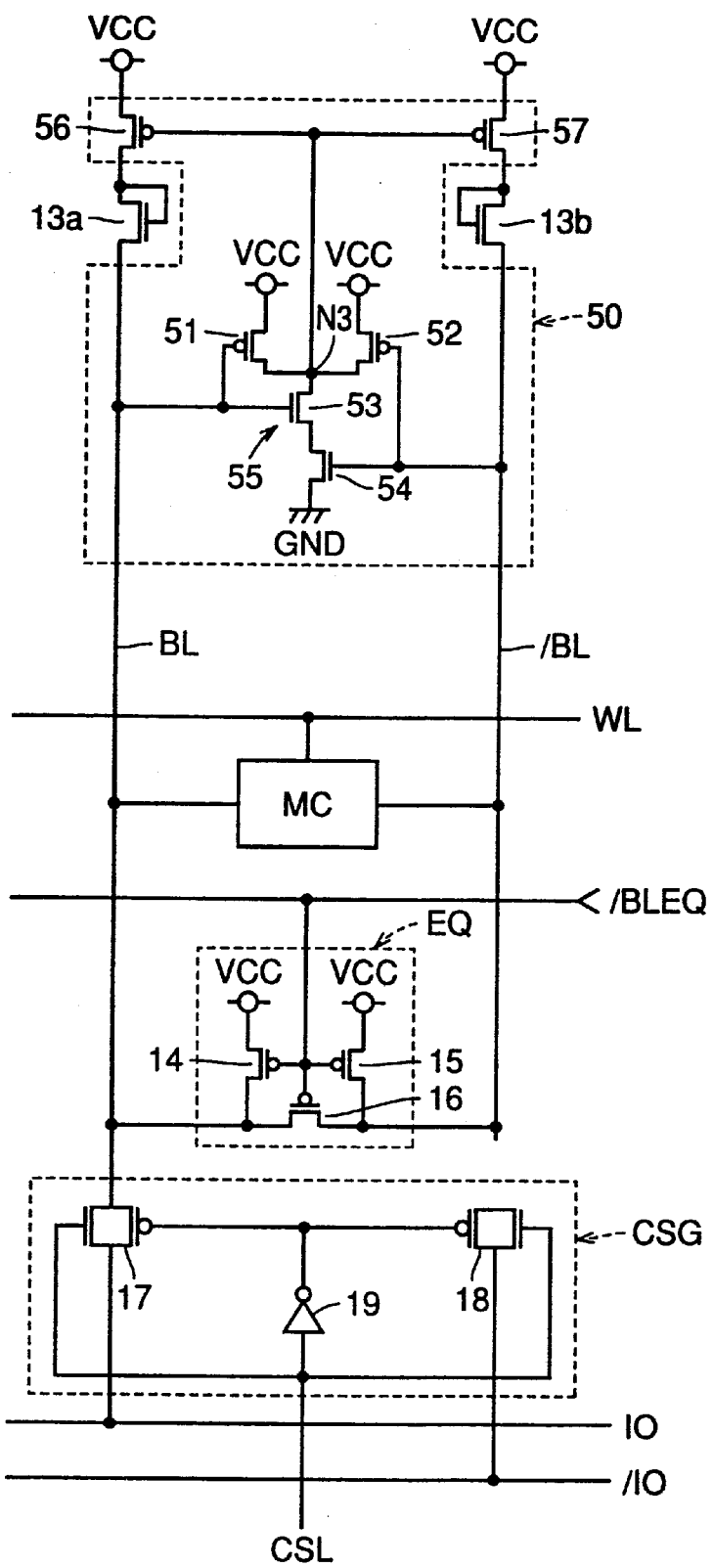
FIG. 19 is a circuit block diagram showing a modification of the third embodiment.
Figure 20:
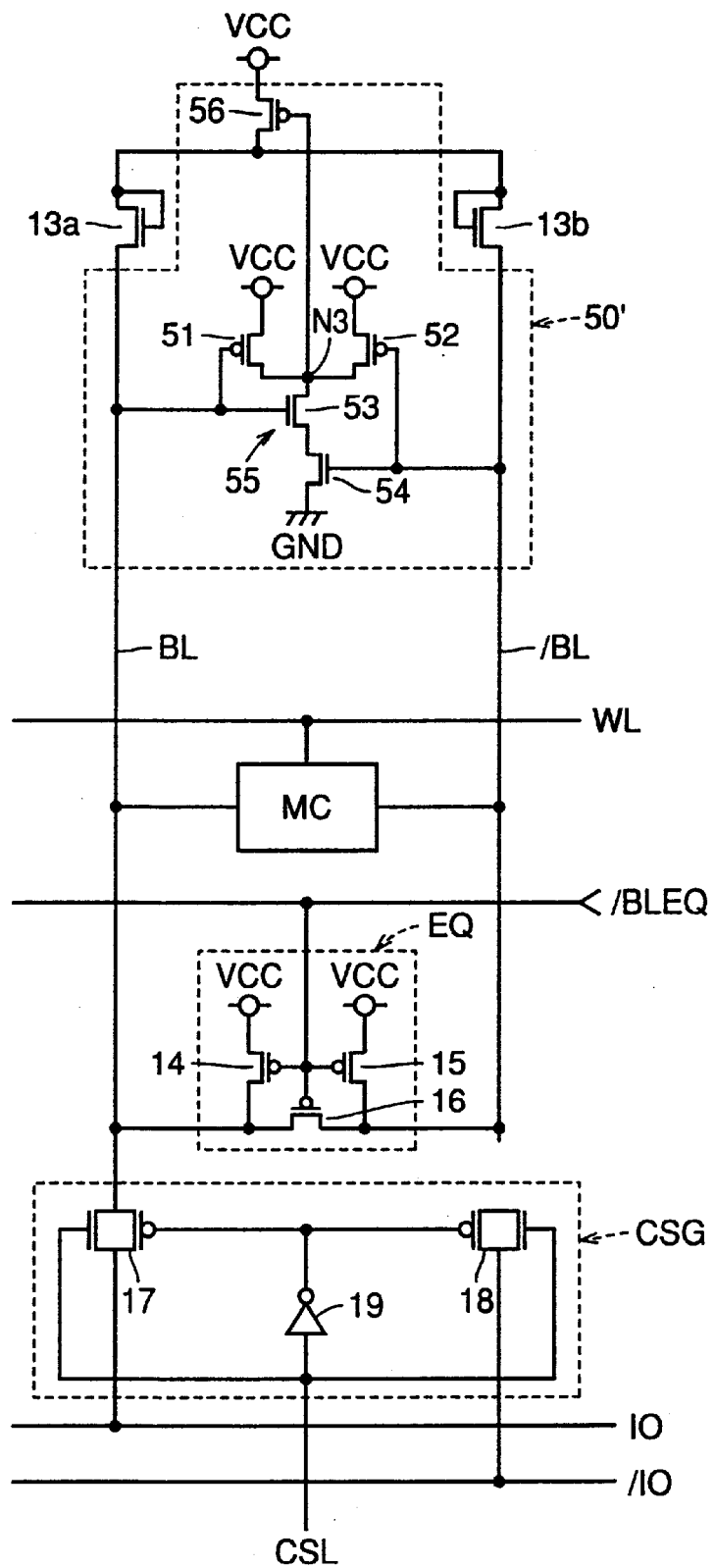
FIG. 20 is a circuit block diagram showing another modification of the third embodiment.

As shown in FIG. 19, P channel MOS transistors 56, 57 may be connected between the power supply potential VCC line and the gates and drains of N channel MOS transistors 13a, 13b, respectively. As shown in FIG. 20, N channel MOS transistor 57 may be eliminated, and the drain of P channel MOS transistor 56 may be connected to the gate and drain of N channel MOS transistor 13b.

Figure 21:
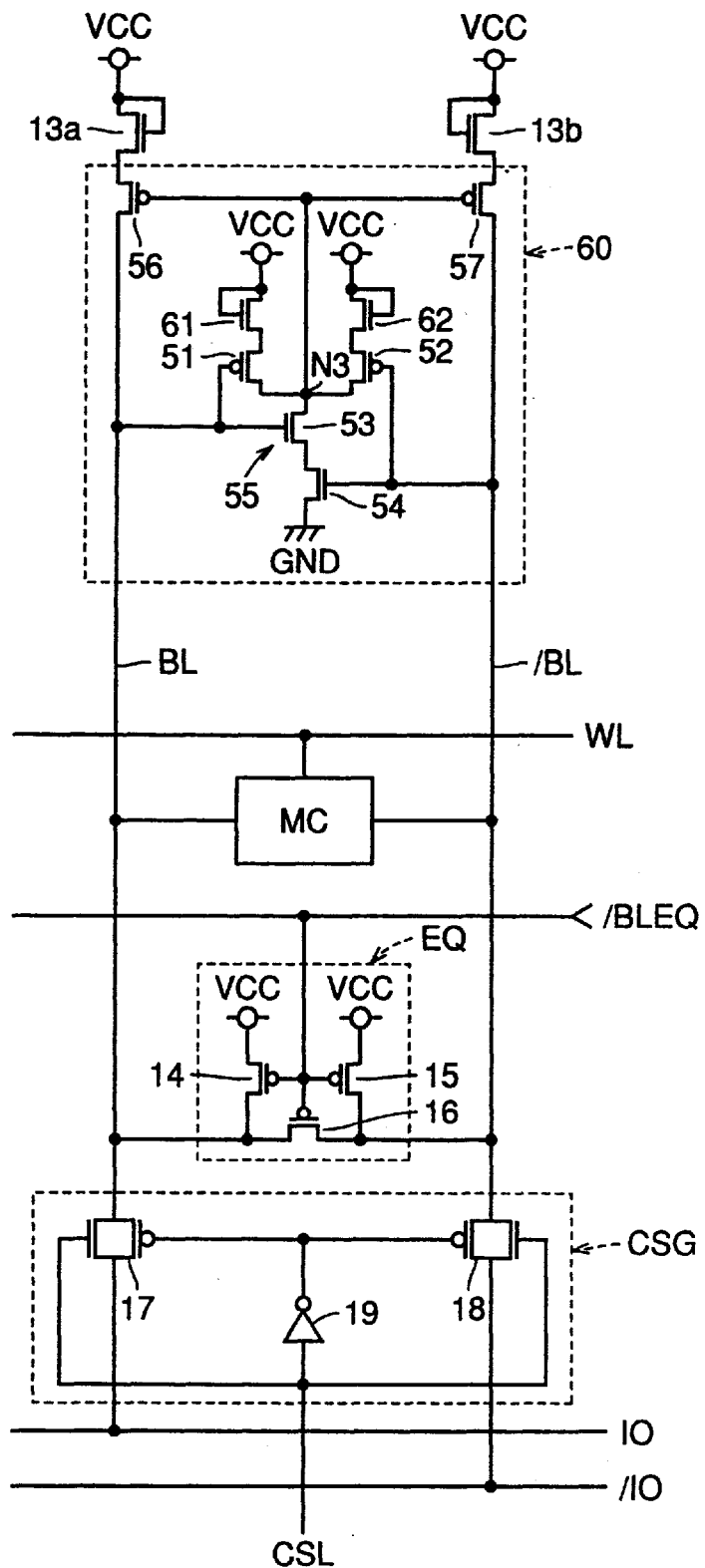
FIG. 21 is a circuit block diagram showing still another modification of the third embodiment.

In a modification shown in FIG. 21, a breaking circuit 60 is provided to correspond to each bit line pair BL, /BL. Breaking circuit 60 is formed by adding, to breaking circuit 50 of FIG. 8, N channel MOS transistors 61, 62 for preventing through cur-rent. N channel MOS transistors 61, 62 are connected between the power supply potential VCC line and the sources of P channel MOS transistors 51, 52, respectively, and have their gates connected to the power supply potential VCC line. In this case, MOS transistors 51, 53 or MOS transistors 52, 54 are prevented from being rendered conductive simultaneously and through current in NAND gate 55 is reduced for the same reason described in the second embodiment.

It is noted that each of N channel MOS transistors 61, 62 forms a diode element. Instead of providing N channel MOS transistors 61, 62, a diode element may be connected between the source of N channel MOS transistor 54 and the ground potential GND line. Furthermore, a P channel MOS transistor which has its gate and drain connected may form the diode element.

Figure 22:
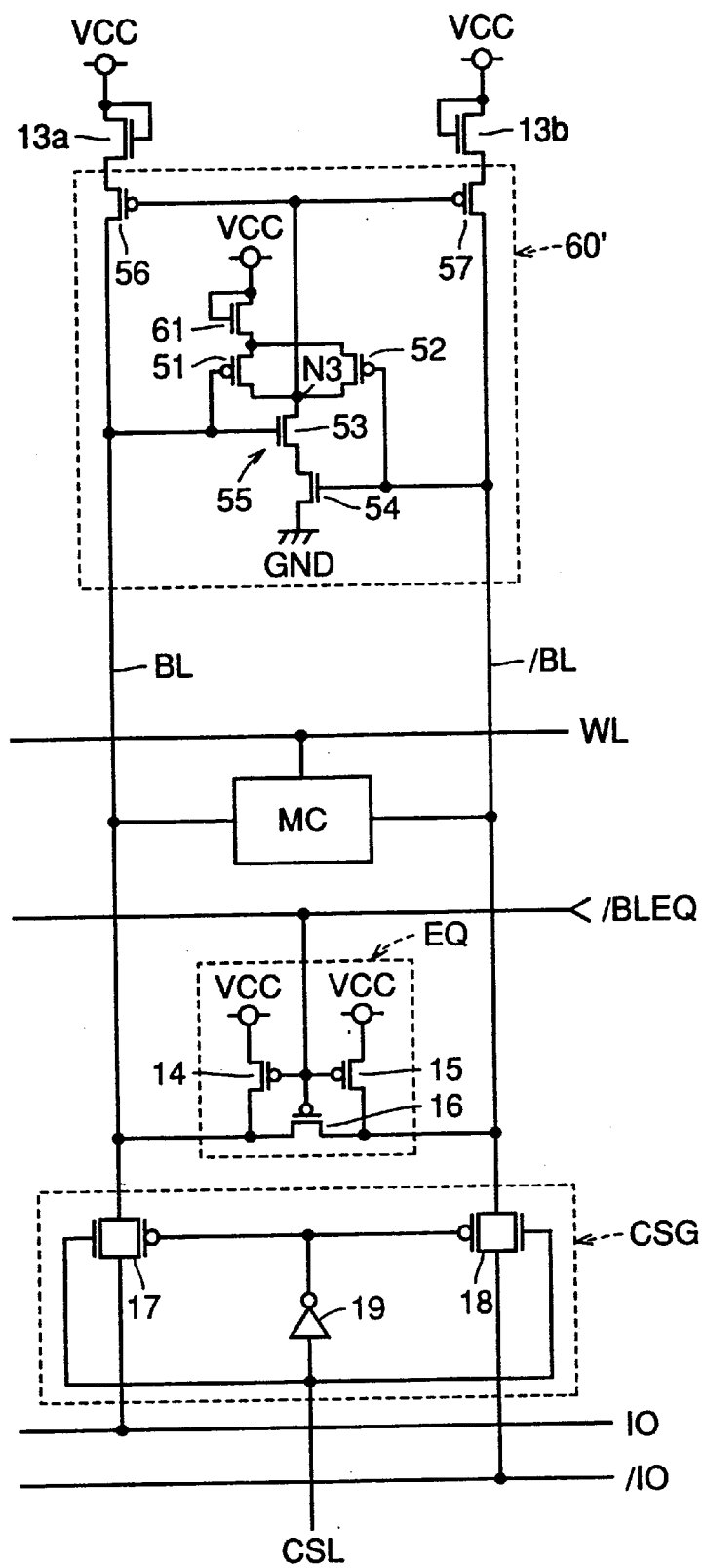
FIG. 22 is a circuit block diagram showing still another modification of the third embodiment.

As shown in FIG. 22, N channel MOS transistor 62 of breaking circuit 60 may be eliminated, and the source of P channel MOS transistor 52 may be connected to the source of N channel MOS transistor 61. It is noted that the diode element for preventing through current N channel MOS transistor 61) may be provided to be shared not only by P channel MOS transistors 51, 52 of one breaking circuit 60' but also by P channel MOS transistors 51, 52 of a plurality of breaking circuits 60'.

Figure 23:
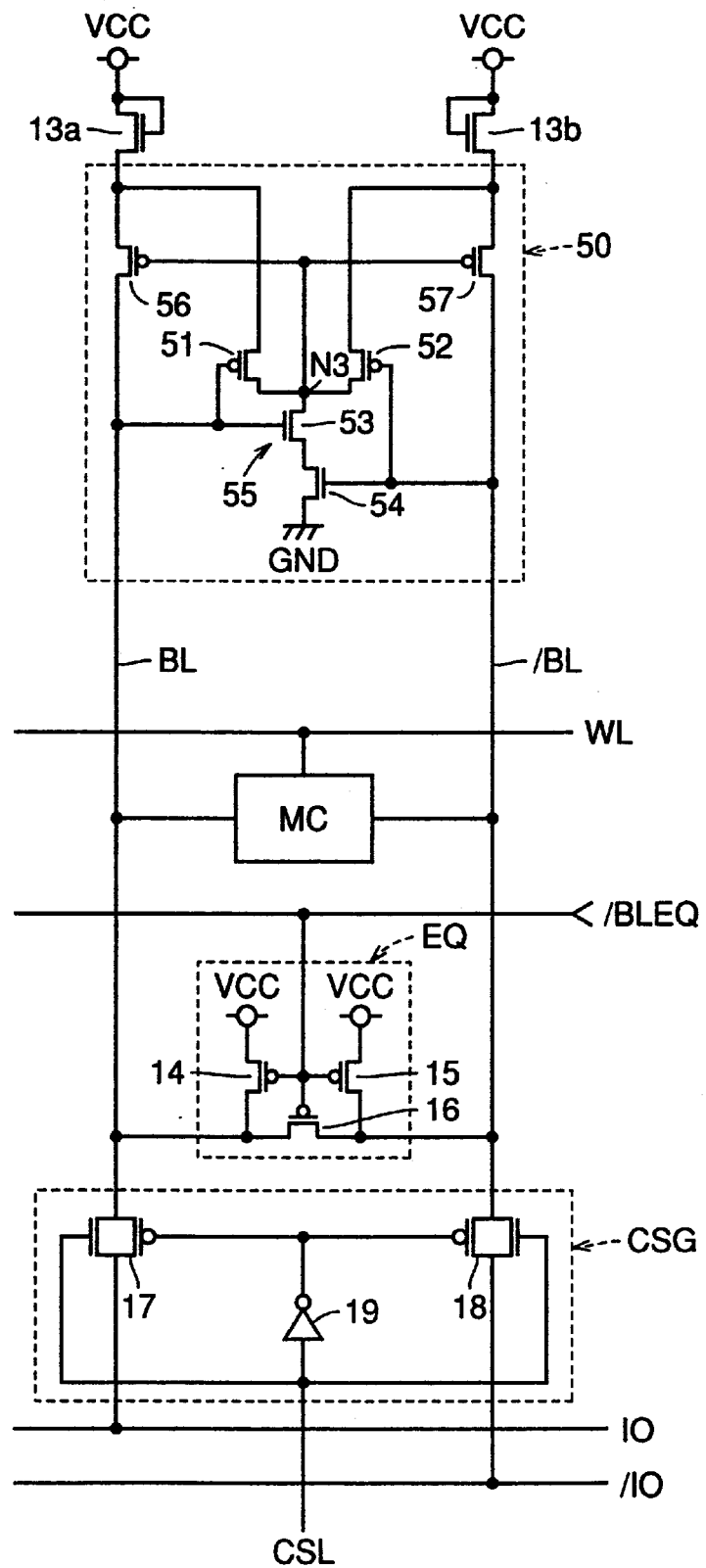
FIG. 23 is a circuit block diagram showing still another modification of the third embodiment.

As shown in FIG. 23, the sources of P channel MOS transistors 51, 52 of breaking circuit 50 may be connected to the sources of N channel MOS transistors 13a, 13b, respectively. In this case, N channel MOS transistors 13a, 13b also function as N channel MOS transistors 61, 62 for preventing through current. Therefore, N channel MOS transistors 61, 62 do not have to be provided separately, and thus the layout area can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static type semiconductor memory device including a spare column to replace a defective column, comprising:
   a memory array including a plurality of memory cells arranged in rows and columns, a word line provided to correspond to each row, and a bit line pair provided to correspond to each column;
   a bit line load provided to correspond to each bit line and connected between a line of a first power supply potential and one end of a corresponding bit line;
   a writing/reading circuit to select one memory cell of said plurality of memory cells according to an address signal and to write/read data to/from the memory cell; and
   a breaking circuit provided to correspond to each bit line pair and, in response to a corresponding bit line assuming a reference potential between said first power supply potential and a second power supply potential, breaking current flowing from the line of said first power supply potential through a corresponding bit line load to the bit line which has assumed said reference potential;
   wherein said breaking circuit includes:
      a switching element provided to correspond to each bit line and connected in series with said bit line load between the line of said first power supply potential and one end of a corresponding bit line, and
      a potential detecting circuit provided to correspond to each bit line and rendering a corresponding switching element non-conductive in response to a corresponding bit line assuming a potential between said reference potential and said second power supply potential;
   said switching element is a first transistor of a first conductivity type, and
   said potential detecting circuit includes an inverter having
      a second transistor of the first conductivity type having a first electrode connected to the line of said first power supply potential, a second electrode connected to an input electrode of said first transistor, and an input electrode connected to a corresponding bit line, and
      a third transistor of a second conductivity type having a first electrode connected to a line of said second power supply potential, a second electrode connected to an input electrode of said first transistor, and an input electrode connected to a corresponding bit line.

2. The static type semiconductor memory device according to claim 1, further comprising:
   at least one diode element inserted between the line of said first power supply potential and the first electrode of said second transistor or between the first electrode of said third transistor and the line of said second power supply potential.

3. The static type semiconductor memory device according to claim 1, wherein said bit line load is a diode element having one electrode connected to the line of said first power supply potential and another electrode connected to one end of a corresponding bit line through said first transistor.

4. A static type semiconductor memory device including a spare column to replace a defective column, comprising:
   a memory array including a plurality of memory cells arranged in rows and columns, a word line provided to correspond to each row, and a bit line pair provided to correspond to each column;
   a bit line load provided to correspond to each bit line and connected between a line of a first power supply potential and one end of a corresponding bit line;
   a writing/reading circuit to select one memory cell of said plurality of memory cells according to an address signal and to write/read data to/from the memory cell; and
   a breaking circuit provided to correspond to each bit line pair and, in response to a corresponding bit line assuming a reference potential between said first power supply potential and a second power supply potential, breaking current flowing from the line of said first power supply potential through a corresponding bit line load to the bit line which has assumed said reference potential;
   wherein said breaking circuit includes:
      a switching element provided to correspond to each bit line and connected in series with said bit line load between the line of said first power supply potential and one end of a corresponding bit line, and
      a potential detecting circuit to render a corresponding switching element non-conductive in response to at least one bit line of a corresponding bit line pair assuming a potential between said reference potential and said second power supply potential.

5. The static type semiconductor memory device according to claim 4, wherein said switching element is a first transistor of a first conductivity type, and
   said potential detecting circuit includes an NAND gate having
      second and third transistors of the first conductivity type having first electrodes connected to the line of said first power supply potential, second electrodes connected to an input electrode of said first transistor, and input electrodes respectively connected to one and another corresponding bit lines,
      a fourth transistor of a second conductivity type having a first electrode connected to the line of said second power supply potential, and an input electrode connected to the another corresponding bit line, and a fifth transistor of the second conductivity type connected between a second electrode of said fourth transistor and the input electrode of said first transistor and having an input electrode connected to the one corresponding bit line.

6. The static type semiconductor memory device according to claim 5, further comprising:

at least one diode element inserted between the line of said first power supply potential and the first electrodes of said second and third transistors or between the first electrode of said fourth transistor and the line of said second power supply potential.

7. The static type semiconductor memory device according to claim 5, wherein said bit line load is a diode element having one electrode connected to the line of said first power supply potential and another electrode connected to one end of a corresponding bit line through said first transistor, and the first electrodes of said second and third transistors are each connected to the another electrode of one and another corresponding diode elements, respectively.

* * * * *